United States Patent
Pao et al.

(10) Patent No.: US 11,505,566 B2
(45) Date of Patent: Nov. 22, 2022

(54) ORGANIC METAL COMPOUND AND ORGANIC LIGHT-EMITTING DEVICE

(71) Applicant: INDUSTRIAL TECHNOLOGY RESEARCH INSTITUTE, Hsinchu (TW)

(72) Inventors: Yu-Chieh Pao, Hsinchu (TW); Jia-Lun Liou, Hsinchu County (TW); Han-Cheng Yeh, Taipei (TW); Po-Jung Hsu, Taipei (TW); Mei-Rurng Tseng, Hsinchu (TW)

(73) Assignee: INDUSTRIAL TECHNOLOGY RESEARCH INSTITUTE, Hsinchu (TW)

(*) Notice: Subject to any disclaimer, the term of this patent is extended or adjusted under 35 U.S.C. 154(b) by 344 days.

(21) Appl. No.: 16/450,006

(22) Filed: Jun. 24, 2019

(65) Prior Publication Data
US 2020/0024294 A1 Jan. 23, 2020

Related U.S. Application Data

(60) Provisional application No. 62/701,945, filed on Jul. 23, 2018.

(30) Foreign Application Priority Data

Dec. 21, 2018 (TW) .................. 107146414

(51) Int. Cl.
*H01L 51/00* (2006.01)
*C07F 15/00* (2006.01)

(52) U.S. Cl.
CPC ...... *C07F 15/0033* (2013.01); *H01L 51/0085* (2013.01)

(58) Field of Classification Search
CPC ............. C07F 15/0033; H01L 51/0085; H01L 51/0062; C09K 2211/185; C09K 11/56; C07D 491/048
See application file for complete search history.

(56) References Cited

U.S. PATENT DOCUMENTS 7,445,857 B2 11/2008 Shen et al.
8,722,207 B2 5/2014 Huang et al.
(Continued)

FOREIGN PATENT DOCUMENTS

CN 103002949 A 3/2013
CN 105111241 A 12/2015
(Continued)

OTHER PUBLICATIONS

Taiwanese Office Action and Search Report for Taiwanese Application No. 107146414, dated Jan. 13, 2020.
(Continued)

*Primary Examiner* — Alexander C Kollias
(74) *Attorney, Agent, or Firm* — Birch, Stewart, Kolasch & Birch, LLP

(57) ABSTRACT

Organic metal compounds and organic light-emitting devices employing the same are provided. The organic metal compound has a chemical structure of Formula (I) or Formula (II):

(Continued)

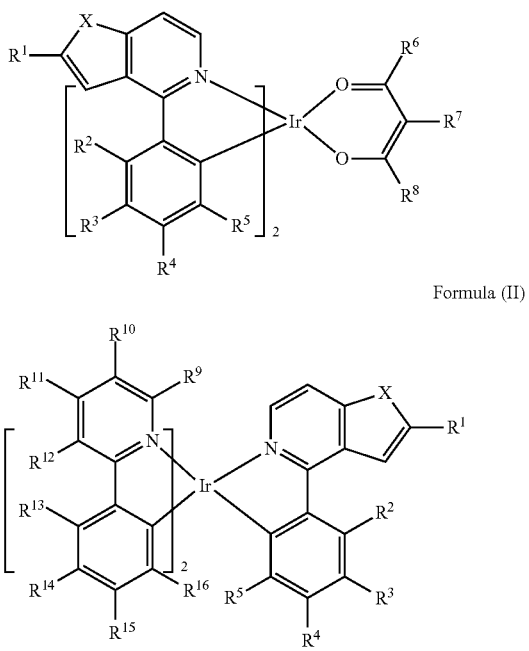

Formula (I)

Formula (II)

In particular, one of the following two conditions (1) and (2) is met:
(1) $R^1$ is deuterium or $C_{1-6}$ deuterated alkyl group, when $R^3$ and $R^4$ are independently hydrogen, halogen, $C_{1-6}$ alkyl group, $C_{1-6}$ fluoroalkyl or $C_{3-12}$ heteroaryl group; and
(2) $R^1$ is hydrogen, deuterium, $C_{1-6}$ alkyl group, $C_{1-6}$ deuterated alkyl group, $C_{3-12}$ heteroaryl group, or $C_{6-12}$ aryl group, when at least one of $R^3$ and $R^4$ is $C_{6-12}$ aryl group or $C_{6-12}$ fluoroaryl group.

8 Claims, 1 Drawing Sheet

(56) References Cited

U.S. PATENT DOCUMENTS

| | | | | |
|---|---|---|---|---|
| 2010/0270916 A1* | 10/2010 | Xia | ........................ | H05B 33/14 546/10 |
| 2012/0061654 A1 | 3/2012 | Rayabarapu et al. | | |
| 2013/0033171 A1 | 2/2013 | Huang et al. | | |
| 2013/0046096 A1* | 2/2013 | De Cola | ............. | H01L 51/0085 546/4 |
| 2013/0116755 A1* | 5/2013 | Anemian | ............... | H05B 33/00 607/88 |
| 2015/0188060 A1* | 7/2015 | Chao | ................... | C07F 15/0033 257/40 |
| 2016/0164006 A1 | 6/2016 | Chao et al. | | |
| 2016/0164007 A1 | 6/2016 | Lin et al. | | |
| 2016/0336520 A1* | 11/2016 | Boudreault | ......... | H01L 51/0085 |
| 2016/0359121 A1 | 12/2016 | Ito et al. | | |
| 2017/0155063 A1 | 6/2017 | Wu et al. | | |
| 2017/0155065 A1 | 6/2017 | Lin et al. | | |

FOREIGN PATENT DOCUMENTS

| | | |
|---|---|---|
| CN | 105505378 A | 4/2016 |
| CN | 106883270 A | 6/2017 |
| TW | I520967 B | 2/2016 |
| TW | I535823 B | 6/2016 |
| TW | I547497 B | 9/2016 |
| TW | 201704444 A | 2/2017 |
| TW | I586672 B | 6/2017 |
| TW | I594998 B | 8/2017 |
| TW | I618710 B | 3/2018 |
| TW | I632147 B | 8/2018 |

OTHER PUBLICATIONS

Ikawa et al., "Photo- and electroluminescence from deep-red- and near-infraredphosphorescent tric-cyclometalated iridium(III) complexes bearing largely π-extended ligands.", Inorganic Chemistry Communications, 38, 14-19, (2013).

Tsujimoto et al., "Pure red electrophosphorescence from polymer light-emitting diodes doped with highly emissive bis-cyclometalated iridium(III) complexes.", Journai of Organometallic Chemistry, 695, 1972-1978, (2010).

Yan et al., "A novel furo[3,2-c]pyridine-based iridium complex for high-performance organic light-emitting diodes with over 30% external quantum efficiency.", J. Mater. Chem. C, 5, 10122-10125, (2017).

Yan et al., "Highly Efficient Phosphorescent Furo[3,2-c]pyridine Based Iridium Complexes with Tunable Emission Colors over the Whole Visible Range.", ACS Appl. Mater. Interfaces, 10, 1888-1896, (2018).

Yan et al., "Methoxyl modification in furo [3,2-c]pyridine-based iridium complexes towards highly efficient green- and orange-emitting electrophosphorescent devices.", J. Mater. Chem. C, 5, 12221-12227, (2017).

Chinese Office Action issued in Chinese patent application No. 201910279389.0 dated Dec. 30, 2021.

Taiwan Office Action issued in Taiwan patent application No. 107146414 dated Feb. 10, 2022.

* cited by examiner

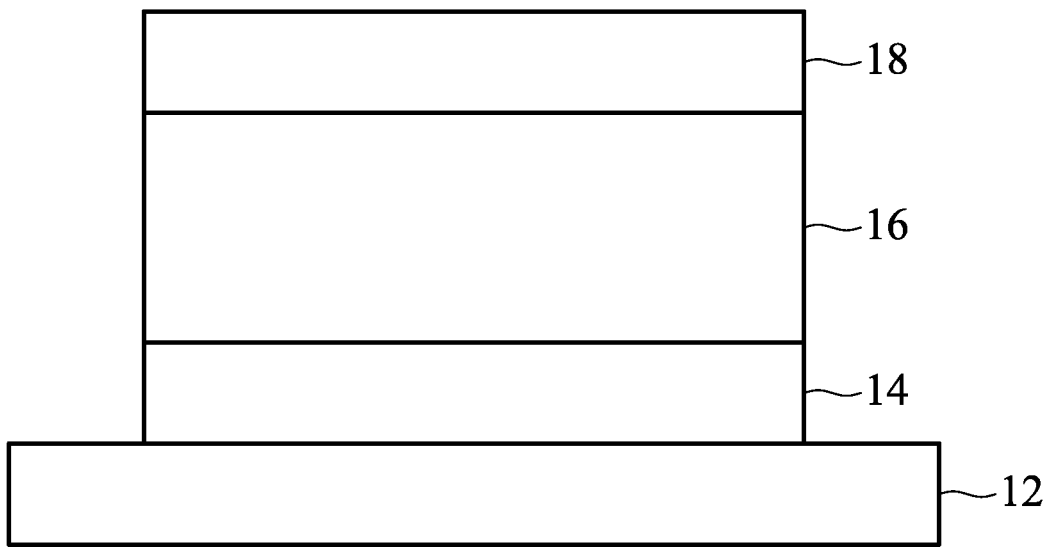

ORGANIC METAL COMPOUND AND ORGANIC LIGHT-EMITTING DEVICE

CROSS REFERENCE TO RELATED APPLICATIONS

This application claims the benefit of U.S. Provisional Application No. 62/701,945, filed on Jul. 23, 2018, which is hereby incorporated herein by reference.

This Application claims priority of Taiwan Patent Application No. 107146414, filed on Dec. 21, 2018, the entirety of which is incorporated by reference herein.

BACKGROUND

Field of the Disclosure

The disclosure relates to an organic metal compound and an organic light-emitting device employing the same.

Description of the Related Art

Organic light-emitting devices are popular in flat panel displays due to their high illumination, light weight, self-illumination, low power consumption, simple fabrication, rapid response time, wide viewing angle, and no backlight requirement.

Generally, an organic electroluminescent device is composed of a light-emission layer sandwiched between a pair of electrodes. When an electric field is applied to the electrodes, the cathode injects electrons into the light-emission layer and the anode injects holes into the light-emission layer. When the electrons recombine with the holes in the light-emission layer, excitons are formed. Recombination of the electron and hole results in light emission.

Depending on the spin states of the hole and electron, the exciton, which results from the recombination of the hole and electron, can have either a triplet or singlet spin state. Luminescence from a singlet exciton results in fluorescence whereas luminescence from a triplet exciton results in phosphorescence. The emissive efficiency of phosphorescence is three times that of fluorescence. Therefore, there is a need for a novel phosphorescent material to increase the emissive efficiency of an OLED.

BRIEF SUMMARY

According to embodiments of the disclosure, the disclosure provides an organic metal compound, which has a chemical structure of Formula (I) or Formula (II):

Formula (I)

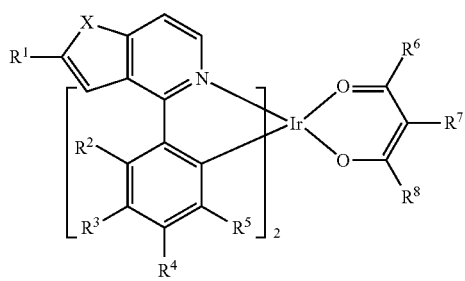

-continued

Formula (II)

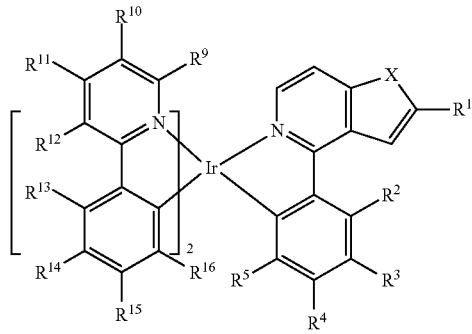

wherein X is O or S; $R^1$ is hydrogen, deuterium, $C_{1-6}$ alkyl group, $C_{1-6}$ deuterated alkyl group, $C_{3-12}$ heteroaryl group or $C_{6-12}$ aryl group; $R^2$, $R^3$, $R^4$ and $R^5$ are independently hydrogen, halogen, $C_{1-6}$ alkyl group, $C_{1-6}$ alkoxy group, $C_{1-6}$ fluoroalkyl group, $C_{3-12}$ heteroaryl group, $C_{6-12}$ aryl group, $C_{7-18}$ alkylaryl group, or $C_{6-12}$ fluoroaryl group; $R^6$, $R^7$ and $R^8$ are independently hydrogen, deuterium, $C_{1-6}$ alkyl group, $C_{1-6}$ deuterated alkyl group, $C_{3-12}$ heteroaryl group or $C_{6-12}$ aryl group; $R^9$, $R^{10}$, $R^{11}$ and $R^{12}$ are independently hydrogen, halogen, deuterium, $C_{1-6}$ alkyl group, $C_{1-6}$ deuterated alkyl group, $C_{1-6}$ fluoroalkyl group, or two adjacent groups of $R^9$, $R^{10}$, $R^{11}$, and $R^{12}$ are optionally combined with the carbon atoms which they are attached to, to form an aryl group or a cycloalkyl group, wherein $R^{13}$, $R^{14}$, $R^{15}$ and $R^{16}$ are independently hydrogen, halogen, $C_{1-6}$ alkyl group, $C_{1-6}$ fluoroalkyl group, or two adjacent groups of $R^{13}$, $R^{14}$, $R^{15}$ and $R^{16}$ are optionally combined with the carbon atoms which they are attached to, to form an aryl group or a cycloalkyl group.

In particular, one of the following two conditions (1) and (2) is met: (1) $R^1$ is deuterium or $C_{1-6}$ deuterated alkyl group, when $R^3$ and $R^4$ are independently hydrogen, halogen, $C_{1-6}$ alkyl group, $C_{1-6}$ alkoxy group, $C_{1-6}$ fluoroalkyl or $C_{3-12}$ heteroaryl group; and (2) $R^1$ is hydrogen, deuterium, $C_{1-6}$ alkyl group, $C_{1-6}$ deuterated alkyl group, $C_{3-12}$ heteroaryl group, or $C_{6-12}$ aryl group, when at least one of $R^3$ and $R^4$ is $C_{6-12}$ aryl group, $C_{7-18}$ alkylaryl group, or $C_{6-12}$ fluoroaryl group.

According to another embodiment of the disclosure, the disclosure provides an organic light-emitting device. The device includes a pair of electrodes and an organic light-emitting element disposed between the electrodes, wherein the organic light-emitting element includes the aforementioned organic metal compound.

BRIEF DESCRIPTION OF THE DRAWINGS

A detailed description is given in the following embodiments with reference to the accompanying drawings. It should be emphasized that many features are not drawn to scale according to standard practice in the industry. In fact, the dimensions of the various components may be arbitrarily increased or decreased for clarity of discussion.

FIG. 1 shows a cross section of an organic light-emitting device disclosed by an embodiment of the disclosure.

DETAILED DESCRIPTION

The following description is of the best-contemplated mode of carrying out the disclosure. This description is made for the purpose of illustrating the general principles of the disclosure and should not be taken in a limiting sense. The scope of the disclosure is best determined by reference to the appended claims.

Organic Metal Compound

According to embodiments of the disclosure, the organic metal compound of the disclosure is a six-coordinate iridium compound having furopyridine ligand, thienopyridine ligand, or both. In particular, the organic metal compound of the disclosure can further have a coordinating ligand of phenylpyridine compound or acetylacetonate compound. The organic metal compound of the disclosure exhibits great thermal stability and electrochemical stability. Due to the specific chemical structure, the organic metal compound of the disclosure can have a suitable highest occupied molecular orbital (HOMO) and lowest unoccupied molecular orbital (LUMO) energy gap, thereby facilitating the electrons recombining with the holes to form excitons, and resulting in enhancing the luminescent efficiency of the organic light-emitting device (such as a green organic light-emitting device) employing the organic metal compound. In addition, according to embodiments of the disclosure, a biphenyl group can be further introduced into the furopyridine ligand or thienopyridine ligand of the organic metal compound of the disclosure in order to extend the conjugated system thereof. As a result, the organic light-emitting device employing the organic metal compound of the disclosure can exhibit improved operating lifespan and luminescent efficiency. Furthermore, according to embodiments of the disclosure, in the organic metal compound of the disclosure, hydrogen atoms bonded to the carbon atom of the furopyridine ligand, thienopyridine ligand, or phenylpyridine ligand can be further replaced by deuterium or deuterated alkyl group, thereby enhancing the thermal stability and electrochemical stability. As a result, the operating lifespan of the organic light-emitting device employing the organic metal compound of the disclosure can be improved.

According to embodiments of the disclosure, the disclosure provides an organic metal compound that can have a chemical structure of Formula (I) or Formula (II):

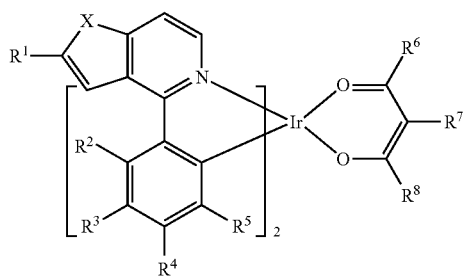

Formula (I)

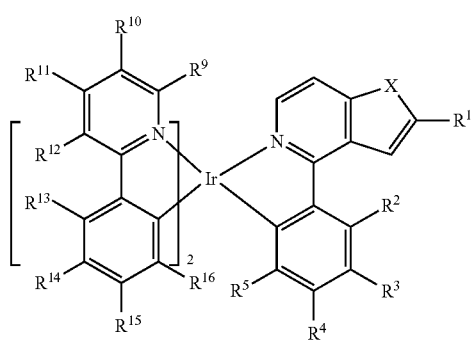

Formula (II)

wherein X is O or S; $R^1$ is hydrogen, deuterium, $C_{1-6}$ alkyl group, $C_{1-6}$ deuterated alkyl group, $C_{3-12}$ heteroaryl group or $C_{6-12}$ aryl group; $R^2$, $R^3$, $R^4$ and $R^5$ are independently hydrogen, halogen, $C_{1-6}$ alkyl group, $C_{1-6}$ alkoxy group, $C_{1-6}$ fluoroalkyl group, $C_{3-12}$ heteroaryl group, $C_{6-12}$ aryl group, $C_{7-18}$ alkylaryl group, or $C_{6-12}$ fluoroaryl group; $R^6$, $R^7$ and $R^8$ are independently hydrogen, deuterium, $C_{1-6}$ alkyl group, $C_{1-6}$ deuterated alkyl group, $C_{3-12}$ heteroaryl group or $C_{6-12}$ aryl group; $R^9$, $R^{10}$, $R^{11}$ and $R^{12}$ are independently hydrogen, halogen, deuterium, $C_{1-6}$ alkyl group, $C_{1-6}$ deuterated alkyl group, $C_{1-6}$ fluoroalkyl group, or two adjacent groups of $R^9$, $R^{10}$, $R^{11}$ and $R^{12}$ are optionally combined with the carbon atoms which they are attached to, to form an aryl group or a cycloalkyl group, wherein $R^{13}$, $R^{14}$, $R^{15}$, and $R^{16}$ are independently hydrogen, halogen, $C_{1-6}$ alkyl group, $C_{1-6}$ fluoroalkyl group, or two adjacent groups of $R^{13}$, $R^{14}$, $R^{15}$ and $R^{16}$ are optionally combined with the carbon atoms which they are attached to, to form an aryl group or a cycloalkyl group.

In particular, one of the following two conditions (1) and (2) among R1, $R^3$ and $R^4$ is met: (1) $R^1$ is deuterium or $C_{1-6}$ deuterated alkyl group, when $R^3$ and $R^4$ are independently hydrogen, halogen, $C_{1-6}$ alkyl group, $C_{1-6}$ alkoxy group, $C_{1-6}$ fluoroalkyl or $C_{3-12}$ heteroaryl group; and (2) $R^1$ is hydrogen, deuterium, $C_{1-6}$ alkyl group, $C_{1-6}$ deuterated alkyl group, $C_{3-12}$ heteroaryl group, or $C_{6-12}$ aryl group, when at least one of $R^3$ and $R^4$ is $C_{6-12}$ aryl group, $C_{7-18}$ alkylaryl group, or $C_{6-12}$ fluoroaryl group.

According to embodiments of the disclosure, $C_{1-6}$ alkyl group can be linear or branched alkyl group. For example, $C_{1-6}$ alkyl group can be methyl group, ethyl group, propyl group (such as n-propyl group or iso-propyl group), butyl group (such as n-butyl group, tert-butyl group, sec-butyl group, or iso-butyl group), pentyl group or hexyl group. According to embodiments of the disclosure, halogen can be fluorine, chlorine, bromine, or iodine. According to embodiments of the disclosure, C1-6 fluoroalkyl group can be linear or branched fluoroalkyl group and can be an alkyl group in which some or all of the hydrogen atoms bonded to the carbon atom are replaced with fluorine atoms, such as fluoromethyl group or fluoroethyl group. For example, fluoromethyl group can be monofluoromethyl group, difluoromethyl group, or trifluoromethyl group; and fluoroethyl group can be monofluoroethyl group, difluoroethyl group, trifluoroethyl group, tetrafluoroethyl, or perfluoroethyl. According to embodiments of the disclosure, $C_{1-6}$ alkoxy group can be linear or branched alkoxy group. For example, $C_{1-6}$ alkoxy group can be methoxy group, ethoxy group, propoxy group, isopropoxy group, n-butoxy group, sec-butoxy group, isobutoxy group, tert-butoxy group, pentyloxy group, or hexyloxy group. According to embodiments of the disclosure, $C_{6-12}$ aryl group can be phenyl group, biphenyl group, or naphthyl group. According to embodiments of the disclosure, $C_{3-12}$ heteroaryl group can be furyl group, imidazolyl group, pyridyl group, thiazolyl group, thienyl group, or triazolyl group. According to embodiments of the disclosure, $C_{1-6}$ deuterated alkyl group can be linear or branched deuterated alkyl group and can be an alkyl group in which some or all of the hydrogen atoms bonded to the carbon atom are replaced with deuterium atoms, such as deuterated methyl group, or deuterated ethyl group. For example, deuterated methyl group can be monodeuterated methyl group, dideuterated methyl group, or trideuterated alkyl group; and deuterated ethyl group can be monodeuterated ethyl group, dideuterated ethyl group, trideuterated ethyl group, tetradeuterated ethyl group, or perdeuterated ethyl group. According to embodiments of the disclosure, cycloalkyl group can be cyclopentyl group or cyclohexyl group. According to embodiments of the disclosure, C7-18 alkylaryl group can be an aryl group in which some or all of the hydrogen atoms bonded to the carbon atom are replaced with alkyl group (such as $C_{1-4}$ alkyl group). For example, $C_{7-18}$ alkylaryl group can be methylphenyl group, or dimethylphenyl group. According to embodiments of the disclosure, $C_{6-12}$ fluoroaryl group can be an aryl group in which some or all of the hydrogen atoms bonded to the carbon atom are replaced with fluorine atoms, such as fluorophenyl group. Herein, the fluorophenyl group can be monofluorophenyl group, difluorophenyl group, trifluorophenyl group, tetrafluorophenyl group, or perfluorophenyl group.

According to embodiments of the disclosure, $R^1$ can be hydrogen, methyl group, ethyl group, propyl group (such as n-propyl group or isopropyl group), butyl group (such as n-butyl, sec-butyl group, iso-butyl group or tert-butyl group), pentyl group, hexyl group, deuterium, deuterated methyl group, deuterated ethyl group, phenyl group, biphenyl group, naphthyl group, furyl group, imidazolyl group, pyridyl group, thiazolyl group, thienyl group, or triazolyl group. According to embodiments of the disclosure, $R^2$, $R^3$, $R^4$ and $R^5$ can be independently hydrogen, fluoromethyl group, ethyl group, propyl group (such as n-propyl group or isopropyl group), butyl group (such as n-butyl, sec-butyl group, iso-butyl group or tert-butyl group), pentyl group, hexyl group, fluoromethyl, fluoroethyl, methoxy group, ethoxy group, propoxy group, isopropoxy group, butoxy group, sec-butoxy group, iso-butoxy group, tert-butoxy group, pentyloxy group, hexyloxy group, phenyl group, biphenyl group, naphthyl group, furyl group, imidazolyl group, pyridyl group, thiazolyl group, thienyl group, triazolyl group, methylphenyl group, or fluorophenyl group. According to embodiments of the disclosure, R6, R7 and R8 can be independently hydrogen, deuterium, methyl group, ethyl group, propyl group (such as n-propyl group or isopropyl group), butyl group (such as n-butyl, sec-butyl group, iso-butyl group or tert-butyl group), pentyl group, hexyl group, deuterated methyl group, or deuterated ethyl group, phenyl group, biphenyl group, naphthyl group, furyl group, imidazolyl group, pyridyl group, thiazolyl group, thienyl group, or triazolyl group. According to embodiments of the disclosure, R9, R10, R11 and R12 can be independently hydrogen, fluorine deuterium, methyl group, ethyl group, propyl group (such as n-propyl group or isopropyl group), butyl group (such as n-butyl, sec-butyl group, iso-butyl group or tert-butyl group), pentyl group, hexyl group, deuterated methyl group, or deuterated ethyl group, fluoromethyl group or fluoroethyl group. According to embodiments of the disclosure, $R^{13}$, $R^{14}$, $R^{15}$ and $R^{16}$ can be independently hydrogen, fluoromethyl group, ethyl group, propyl group (such as n-propyl group or isopropyl group), butyl group (such as n-butyl, sec-butyl group, iso-butyl group or tert-butyl group), pentyl group, hexyl group, fluoromethyl group or fluoroethyl group.

According to embodiments of the disclosure, $R^1$ can be deuterium, deuterated methyl group, or deuterated ethyl group, when $R^3$ and $R^4$ are independently hydrogen, fluoromethyl group, ethyl group, propyl group (such as n-propyl group or isopropyl group), butyl group (such as n-butyl, sec-butyl group, iso-butyl group or tert-butyl group), pentyl group, hexyl group, fluoromethyl, fluoroethyl, methoxy group, ethoxy group, propoxy group, isopropoxy group, butoxy group, sec-butoxy group, iso-butoxy group, tert-butoxy group, pentyloxy group, hexyloxy group, furyl group, imidazolyl group, pyridyl group, thiazolyl group, thienyl group, or triazolyl group (i.e. when all $R^3$ and $R^4$ are not $C_{6-12}$ aryl group, $C_{7-18}$ alkylaryl group, or $C_{6-12}$ fluoroaryl group). According to embodiments of the disclosure, when R1 of the organic metal compound of Formula (I) or Formula (II) is deuterium, deuterated methyl group, or deuterated ethyl group (i.e. the hydrogen atom bonded to the carbon atom, which is adjacent to the oxide atom of furopyridine moiety, is replaced by deuterium atom, deuterated methyl group, or deuterated ethyl group; or the hydrogen atom bonded to the carbon atom, which is adjacent to the sulfur atom of thienopyridine moiety, is replaced by deuterium atom, deuterated methyl group, or deuterated ethyl group), the electrochemical stability and thermal stability of the organic metal compound can be significantly enhanced. As a result, the operating lifespan of the organic light-emitting device can be effectively improved.

According to embodiments of the disclosure, $R^1$ can be hydrogen, deuterium, methyl group, ethyl group, propyl group (such as n-propyl group or isopropyl group), butyl group (such as n-butyl, sec-butyl group, iso-butyl group or tert-butyl group), pentyl group, hexyl group, deuterated methyl group, deuterated ethyl group, phenyl group, biphenyl group, naphthyl group, furyl group, imidazolyl group, pyridyl group, thiazolyl group, thienyl group, or triazolyl group, when at least one of $R^3$ and $R^4$ is phenyl group, biphenyl group, naphthyl group, methylphenyl group, dimethylphenyl group, or fluorophenyl group. According to embodiments of the disclosure, when at least one of $R^3$ and $R^4$ of the organic metal compound of Formula (I) or Formula (II) is phenyl group, biphenyl group, naphthyl group, methylphenyl group, dimethylphenyl group, or fluorophenyl group, the furopyridine ligand or thienopyridine ligand of the organic metal compound has a biphenyl group. As a result, the conjugated system of the furopyridine ligand or thienopyridine ligand can be extended. Therefore, the organic light-emitting device employing the organic metal compound of the disclosure can exhibit improved operating lifespan and luminescent efficiency. According to embodiments of the disclosure, when one of $R^3$ and $R^4$ is phenyl group, biphenyl group, naphthyl group, methylphenyl group, dimethylphenyl group, or fluorophenyl group, the other one can be hydrogen, or fluorine.

According to embodiments of the disclosure, the organic metal compound is

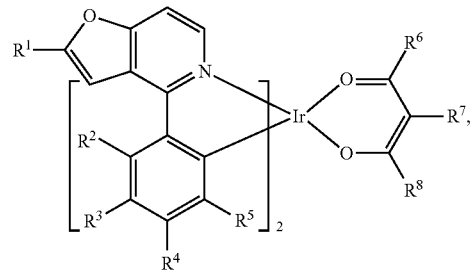

wherein $R^1$ is hydrogen, deuterium, $C_{1-6}$ alkyl group, $C_{1-6}$ deuterated alkyl group, $C_{3-12}$ heteroaryl group or $C_{6-12}$ aryl group; $R^2$, $R^3$, $R^4$ and $R^5$ are independently hydrogen, halogen, $C_{1-6}$ alkyl group, $C_{1-6}$ alkoxy group, $C_{1-6}$ fluoroalkyl group, $C_{3-12}$ heteroaryl group, $C_{6-12}$ aryl group, $C_{7-18}$ alkylaryl group, or $C_{6-12}$ fluoroaryl group; and $R^6$, $R^7$ and $R^8$ are independently hydrogen, deuterium, $C_{1-6}$ alkyl group, $C_{1-6}$ deuterated alkyl group, $C_{3-12}$ heteroaryl group or $C_{6-12}$ aryl group. In particular, one of the following two conditions (1) and (2) is met: (1) $R^1$ is deuterium or $C_{1-6}$ deuterated alkyl group, when $R^3$ and $R^4$ are independently hydrogen, halogen, $C_{1-6}$ alkyl group, $C_{1-6}$ alkoxy group, $C_{1-6}$ fluoroalkyl or $C_{3-12}$ heteroaryl group; and (2) $R^1$ is hydrogen, deuterium, $C_{1-6}$ alkyl group, $C_{1-6}$ deuterated alkyl group, $C_{3-12}$ heteroaryl group, or $C_{6-12}$ aryl group, when at least one of $R^3$ and $R^4$ is $C_{6-12}$ aryl group, $C_{7-18}$ alkylaryl group, or $C_{6-12}$ fluoroaryl group.

According to embodiments of the disclosure, the organic metal compound can be

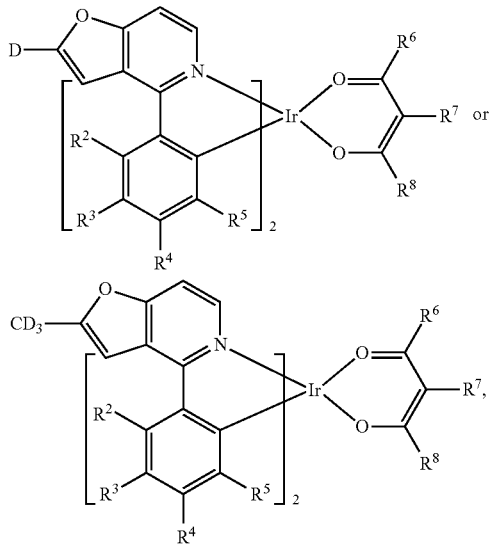

wherein $R^2$, $R^3$, $R^4$ and $R^5$ are independently hydrogen, halogen, $C_{1-6}$ alkyl group, $C_{1-6}$ alkoxy group, $C_{1-6}$ fluoroalkyl group, $C_{3-12}$ heteroaryl group, $C_{6-12}$ aryl group, $C_{7-18}$ alkylaryl group, or $C_{6-12}$ fluoroaryl group; and $R^6$, $R^7$ and $R^8$ are independently hydrogen, deuterium, $C_{1-6}$ alkyl group, $C_{1-6}$ deuterated alkyl group, $C_{3-12}$ heteroaryl group or $C_{6-12}$ aryl group.

According to embodiments of the disclosure, the organic metal compound can be

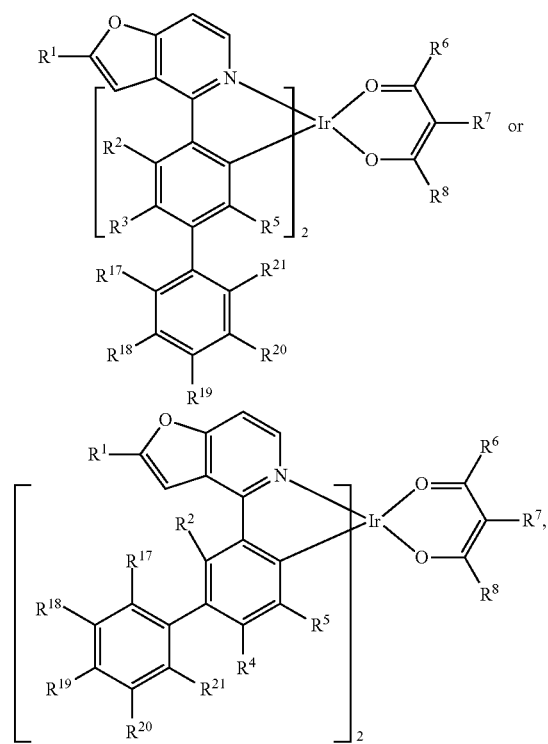

wherein $R^1$ is hydrogen, deuterium, $C_{1-6}$ alkyl group, $C_{1-6}$ deuterated alkyl group, $C_{3-12}$ heteroaryl group or $C_{6-12}$ aryl group; $R^2$, $R^3$, $R^4$ and $R^5$ are independently hydrogen, halogen, $C_{1-6}$ alkyl group, $C_{1-6}$ alkoxy group, $C_{1-6}$ fluoroalkyl group, $C_{3-12}$ heteroaryl group, $C_{6-12}$ aryl group, $C_{7-18}$ alkylaryl group, or $C_{6-12}$ fluoroaryl group; $R^6$, $R^7$ and $R^8$ are independently hydrogen, deuterium, $C_{1-6}$ alkyl group, $C_{1-6}$ deuterated alkyl group, $C_{3-12}$ heteroaryl group or $C_{6-12}$ aryl group; and $R^{17}$, $R^{18}$, $R^{19}$, $R^{20}$ and $R^{21}$ are independently hydrogen, fluorine or methyl group.

According to embodiments of the disclosure, the organic metal compound can be

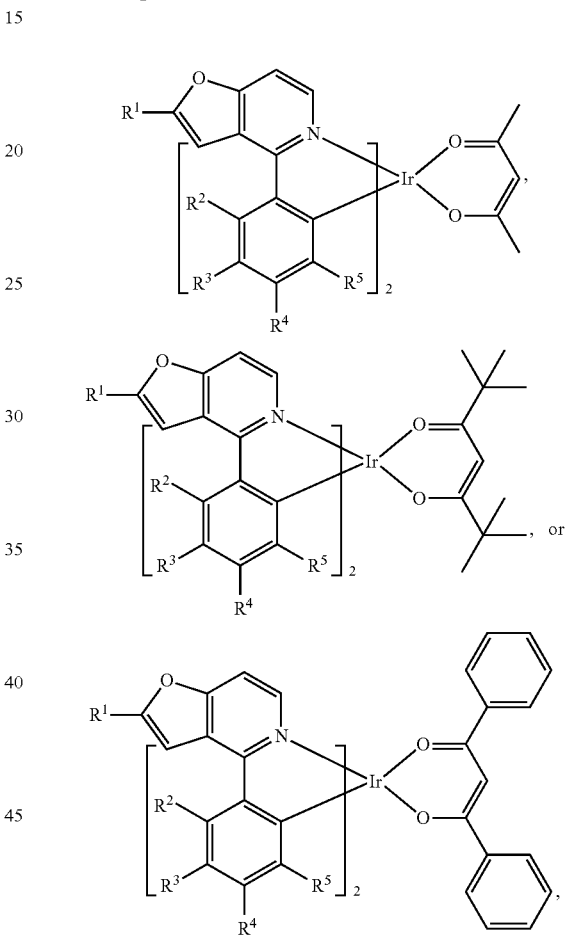

wherein $R^1$ is hydrogen, deuterium, $C_{1-6}$ alkyl group, $C_{1-6}$ deuterated alkyl group, $C_{3-12}$ heteroaryl group or $C_{6-12}$ aryl group; $R^2$, $R^3$, $R^4$ and $R^5$ are independently hydrogen, halogen, $C_{1-6}$ alkyl group, $C_{1-6}$ alkoxy group, $C_{1-6}$ fluoroalkyl group, $C_{3-12}$ heteroaryl group, $C_{6-12}$ aryl group, $C_{7-18}$ alkylaryl group, or $C_{6-12}$ fluoroaryl group. In particular, one of the following two conditions (1) and (2) is met: (1) $R^1$ is deuterium or $C_{1-6}$ deuterated alkyl group, when $R^3$ and $R^4$ are independently hydrogen, halogen, $C_{1-6}$ alkyl group, $C_{1-6}$ alkoxy group, $C_{1-6}$ fluoroalkyl or $C_{3-12}$ heteroaryl group; and (2) $R^1$ is hydrogen, deuterium, $C_{1-6}$ alkyl group, $C_{1-6}$ deuterated alkyl group, $C_{3-12}$ heteroaryl group, or $C_{6-12}$ aryl group, when at least one of $R^3$ and $R^4$ is $C_{6-12}$ aryl group, $C_{7-18}$ alkylaryl group, or $C_{6-12}$ fluoroaryl group.

According to embodiments of the disclosure, the organic metal compound can be

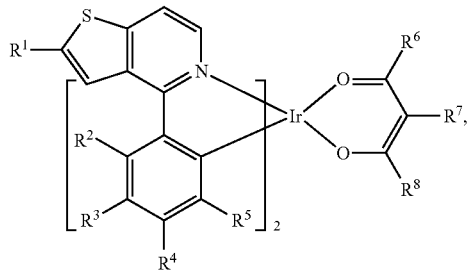

wherein $R^1$ is hydrogen, deuterium, $C_{1-6}$ alkyl group, $C_{1-6}$ deuterated alkyl group, $C_{3-12}$ heteroaryl group or $C_{6-12}$ aryl group; $R^2$, $R^3$, $R^4$ and $R^5$ are independently hydrogen, halogen, $C_{1-6}$ alkyl group, $C_{1-6}$ alkoxy group, $C_{1-6}$ fluoroalkyl group, $C_{3-12}$ heteroaryl group, $C_{6-12}$ aryl group, $C_{7-18}$ alkylaryl group, or $C_{6-12}$ fluoroaryl group; and $R^6$, $R^7$ and $R^8$ are independently hydrogen, deuterium, $C_{1-6}$ alkyl group, $C_{1-6}$ deuterated alkyl group, $C_{3-12}$ heteroaryl group or $C_{6-12}$ aryl group. In particular, one of the following two conditions (1) and (2) is met: (1) $R^1$ is deuterium or $C_{1-6}$ deuterated alkyl group, when $R^3$ and $R^4$ are independently hydrogen, halogen, $C_{1-6}$ alkyl group, $C_{1-6}$ alkoxy group, $C_{1-6}$ fluoroalkyl or $C_{3-12}$ heteroaryl group; and (2) $R^1$ is hydrogen, deuterium, $C_{1-6}$ alkyl group, $C_{1-6}$ deuterated alkyl group, $C_{3-12}$ heteroaryl group, or $C_{6-12}$ aryl group, when at least one of $R^3$ and $R^4$ is $C_{6-12}$ aryl group, $C_{7-18}$ alkylaryl group, or $C_{6-12}$ fluoroaryl group.

According to embodiments of the disclosure, the organic metal compound can be

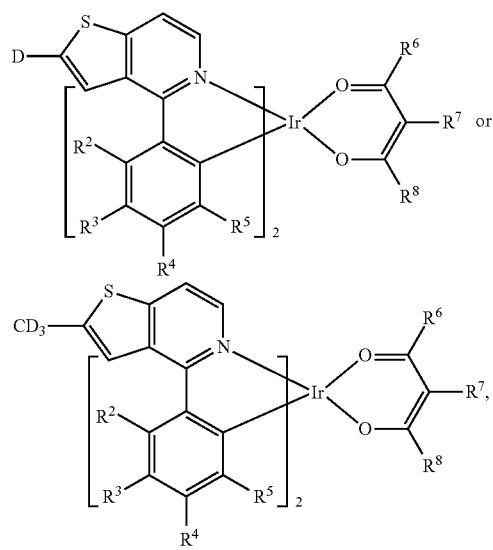

wherein $R^2$, $R^3$, $R^4$ and $R^5$ are independently hydrogen, halogen, $C_{1-6}$ alkyl group, $C_{1-6}$ alkoxy group, $C_{1-6}$ fluoroalkyl group, $C_{3-12}$ heteroaryl group, $C_{6-12}$ aryl group, $C_{7-18}$ alkylaryl group, or $C_{6-12}$ fluoroaryl group; and $R^6$, $R^7$ and $R^8$ are independently hydrogen, deuterium, $C_{1-6}$ alkyl group, $C_{1-6}$ deuterated alkyl group, $C_{3-12}$ heteroaryl group or $C_{6-12}$ aryl group.

According to embodiments of the disclosure, the organic metal compound can be

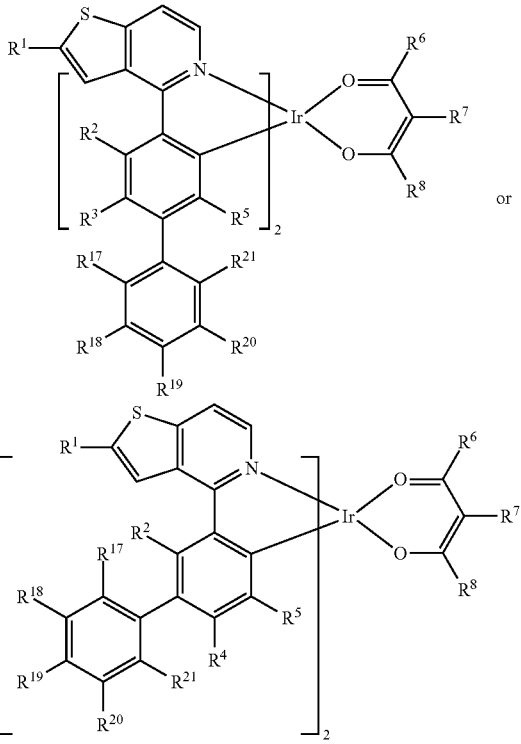

wherein $R^1$ is hydrogen, deuterium, $C_{1-6}$ alkyl group, $C_{1-6}$ deuterated alkyl group, $C_{3-12}$ heteroaryl group or $C_{6-12}$ aryl group; $R^2$, $R^3$, $R^4$ and $R^5$ are independently hydrogen, halogen, $C_{1-6}$ alkyl group, $C_{1-6}$ alkoxy group, $C_{1-6}$ fluoroalkyl group, $C_{3-12}$ heteroaryl group, $C_{6-12}$ aryl group, $C_{7-18}$ alkylaryl group, or $C_{6-12}$ fluoroaryl group; $R^6$, $R^7$ and $R^8$ are independently hydrogen, deuterium, $C_{1-6}$ alkyl group, $C_{1-6}$ deuterated alkyl group, $C_{3-12}$ heteroaryl group or $C_{6-12}$ aryl group; and $R^{17}$, $R^{18}$, $R^{19}$, $R^{20}$ and $R^{21}$ are independently hydrogen, fluorine or methyl group.

According to embodiments of the disclosure, the organic metal compound can be

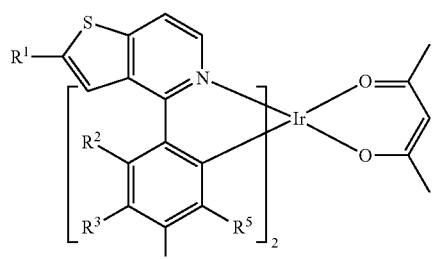

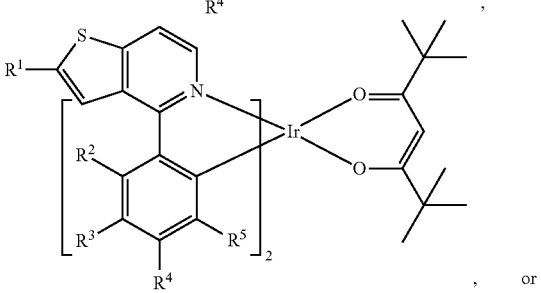

, or

-continued

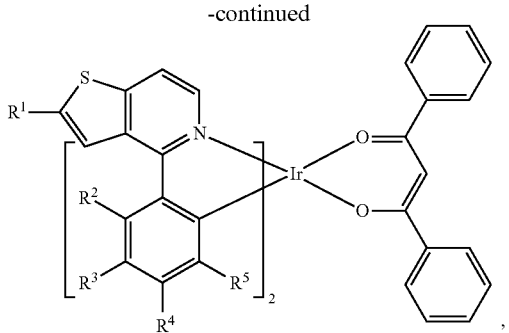

wherein $R^1$ is hydrogen, deuterium, $C_{1-6}$ alkyl group, $C_{1-6}$ deuterated alkyl group, $C_{3-12}$ heteroaryl group or $C_{6-12}$ aryl group; $R^2$, $R^3$, $R^4$ and $R^5$ are independently hydrogen, halogen, $C_{1-6}$ alkyl group, $C_{1-6}$ alkoxy group, $C_{1-6}$ fluoroalkyl group, $C_{3-12}$ heteroaryl group, $C_{6-12}$ aryl group, $C_{7-18}$ alkylaryl group, or $C_{6-12}$ fluoroaryl group. In particular, one of the following two conditions (1) and (2) is met: (1) $R^1$ is deuterium or $C_{1-6}$ deuterated alkyl group, when $R^3$ and $R^4$ are independently hydrogen, halogen, $C_{1-6}$ alkyl group, $C_{1-6}$ alkoxy group, $C_{1-6}$ fluoroalkyl or $C_{3-12}$ heteroaryl group; and (2) $R^1$ is hydrogen, deuterium, $C_{1-6}$ alkyl group, $C_{1-6}$ deuterated alkyl group, $C_{3-12}$ heteroaryl group, or $C_{6-12}$ aryl group, when at least one of $R^3$ and $R^4$ is $C_{6-12}$ aryl group, $C_{7-18}$ alkylaryl group, or $C_{6-12}$ fluoroaryl group.

According to embodiments of the disclosure, the organic metal compound can be wherein

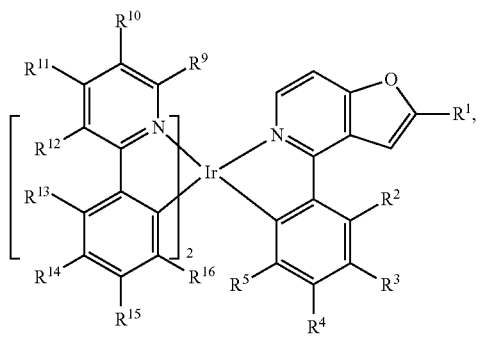

wherein $R^1$ is hydrogen, deuterium, $C_{1-6}$ alkyl group, $C_{1-6}$ deuterated alkyl group, $C_{3-12}$ heteroaryl group or $C_{6-12}$ aryl group; $R^2$, $R^3$, $R^4$ and $R^5$ are independently hydrogen, halogen, $C_{1-6}$ alkyl group, $C_{1-6}$ alkoxy group, $C_{1-6}$ fluoroalkyl group, $C_{3-12}$ heteroaryl group, $C_{6-12}$ aryl group, $C_{7-18}$ alkylaryl group, or $C_{6-12}$ fluoroaryl group; $R^9$, $R^{10}$, $R^{11}$ and $R^{12}$ are independently hydrogen, halogen, deuterium, $C_{1-6}$ alkyl group, $C_{1-6}$ deuterated alkyl group, $C_{1-6}$ fluoroalkyl group, or two adjacent groups of $R^9$, $R^{10}$, $R^{11}$ and $R^{12}$ are optionally combined with the carbon atoms which they are attached to, to form an aryl group or a cycloalkyl group; and $R^{13}$, $R^{14}$, $R^{15}$ and $R^{16}$ are independently hydrogen, halogen, $C_{1-6}$ alkyl group, $C_{1-6}$ fluoroalkyl group, or two adjacent groups of $R^{13}$, $R^{14}$, $R^{15}$ and $R^{16}$ are optionally combined with the carbon atoms which they are attached to, to form an aryl group or a cycloalkyl group. In particular, one of the following two conditions (1) and (2) is met: (1) $R^1$ is deuterium or $C_{1-6}$ deuterated alkyl group, when $R^3$ and $R^4$ are independently hydrogen, halogen, $C_{1-6}$ alkyl group, $C_{1-6}$ alkoxy group, $C_{1-6}$ fluoroalkyl or $C_{3-12}$ heteroaryl group; and (2) $R^1$ is hydrogen, deuterium, $C_{1-6}$ alkyl group, $C_{1-6}$ deuterated alkyl group, $C_{3-12}$ heteroaryl group, or $C_{6-12}$ aryl group, when at least one of $R^3$ and $R^4$ is $C_{6-12}$ aryl group, $C_{7-18}$ alkylaryl group, or $C_{6-12}$ fluoroaryl group.

According to embodiments of the disclosure, the organic metal compound can be

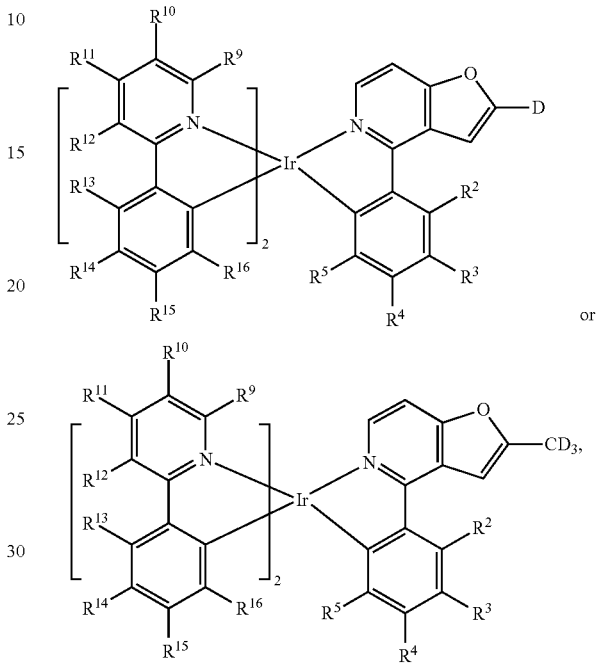

wherein $R^2$, $R^3$, $R^4$ and $R^5$ are independently hydrogen, halogen, $C_{1-6}$ alkyl group, $C_{1-6}$ alkoxy group, $C_{1-6}$ fluoroalkyl group, $C_{3-12}$ heteroaryl group, $C_{6-12}$ aryl group, $C_{7-18}$ alkylaryl group, or $C_{6-12}$ fluoroaryl group; $R^9$, $R^{10}$, $R^{11}$ and $R^{12}$ are independently hydrogen, halogen, deuterium, $C_{1-6}$ alkyl group, $C_{1-6}$ deuterated alkyl group, $C_{1-6}$ fluoroalkyl group, or two adjacent groups of $R^9$, $R^{10}$, $R^{11}$ and $R^{12}$ are optionally combined with the carbon atoms which they are attached to, to form an aryl group or a cycloalkyl group; and $R^{13}$, $R^{14}$, $R^{15}$ and $R^{16}$ are independently hydrogen, halogen, $C_{1-6}$ alkyl group, $C_{1-6}$ fluoroalkyl group, or two adjacent groups of $R^{13}$, $R^{14}$, $R^{15}$ and $R^{16}$ are optionally combined with the carbon atoms which they are attached to, to form an aryl group or a cycloalkyl group.

According to embodiments of the disclosure, the organic metal compound can be

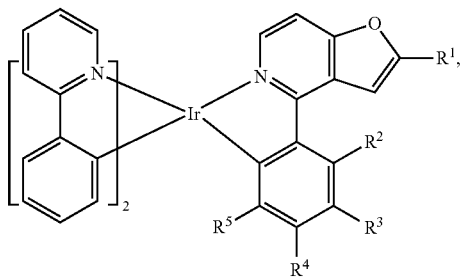

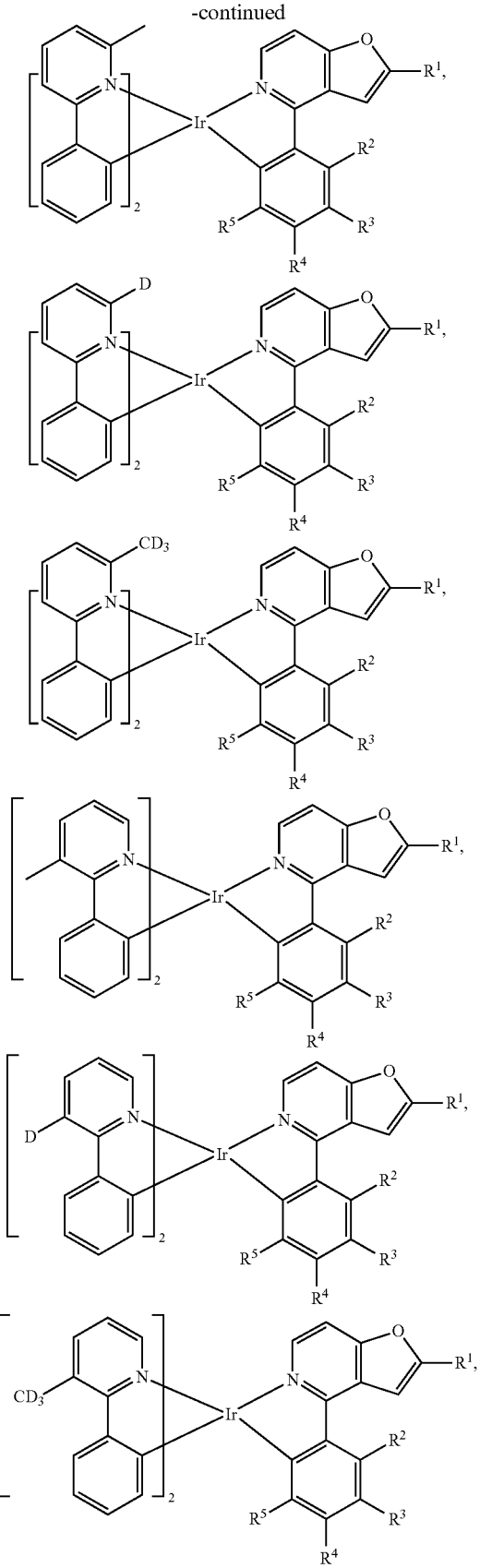

group; $R^2$, $R^3$, $R^4$ and $R^5$ are independently hydrogen, halogen, $C_{1-6}$ alkyl group, $C_{1-6}$ alkoxy group, $C_{1-6}$ fluoroalkyl group, $C_{3-12}$ heteroaryl group, $C_{6-12}$ aryl group, $C_{7-18}$ alkylaryl group, or $C_{6-12}$ fluoroaryl group. In particular, one of the following two conditions (1) and (2) is met: (1) $R^1$ is deuterium or $C_{1-6}$ deuterated alkyl group, when $R^3$ and $R^4$ are independently hydrogen, halogen, $C_{1-6}$ alkyl group, $C_{1-6}$ alkoxy group, $C_{1-6}$ fluoroalkyl or $C_{3-12}$ heteroaryl group; and (2) $R^1$ is hydrogen, deuterium, $C_{1-6}$ alkyl group, $C_{1-6}$ deuterated alkyl group, $C_{3-12}$ heteroaryl group, or $C_{6-12}$ aryl group, when at least one of $R^3$ and $R^4$ is $C_{6-12}$ aryl group, $C_{7-18}$ alkylaryl group, or $C_{6-12}$ fluoroaryl group.

According to embodiments of the disclosure, the organic metal compound can be

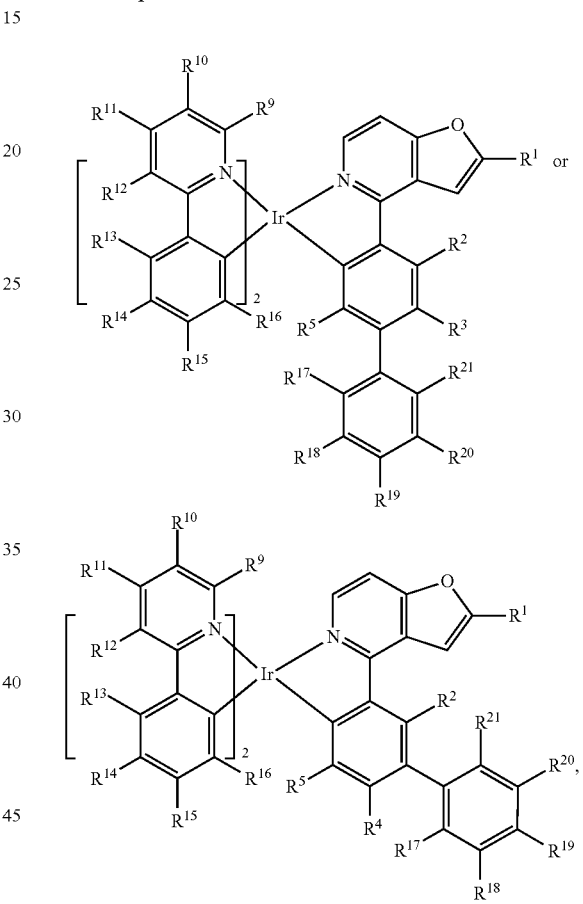

wherein $R^1$ is hydrogen, deuterium, $C_{1-6}$ alkyl group, $C_{1-6}$ deuterated alkyl group, $C_{3-12}$ heteroaryl group or $C_{6-12}$ aryl group; $R^2$, $R^3$, $R^4$ and $R^5$ are independently hydrogen, halogen, $C_{1-6}$ alkyl group, $C_{1-6}$ alkoxy group, $C_{1-6}$ fluoroalkyl group, $C_{3-12}$ heteroaryl group, $C_{6-12}$ aryl group, $C_{7-18}$ alkylaryl group, or $C_{6-12}$ fluoroaryl group; $R^9$, $R^{10}$, $R^{11}$ and $R^{12}$ are independently hydrogen, halogen, deuterium, $C_{1-6}$ alkyl group, $C_{1-6}$ deuterated alkyl group, $C_{1-6}$ fluoroalkyl group, or two adjacent groups of $R^9$, $R^{10}$, $R^{11}$ and $R^{12}$ are optionally combined with the carbon atoms which they are attached to, to form an aryl group or a cycloalkyl group; and $R^{13}$, $R^{14}$, $R^{15}$ and $R^{16}$ are independently hydrogen, halogen, $C_{1-6}$ alkyl group, $C_{1-6}$ fluoroalkyl group, or two adjacent groups of $R^{13}$, $R^{14}$, $R^{15}$ and $R^{16}$ are optionally combined with the carbon atoms which they are attached to, to form an aryl group or a cycloalkyl group; and $R^{17}$, $R^{18}$, $R^{19}$, $R^{20}$ and $R^{21}$ are independently hydrogen, fluorine or methyl group.

According to embodiments of the disclosure, the organic metal compound can be

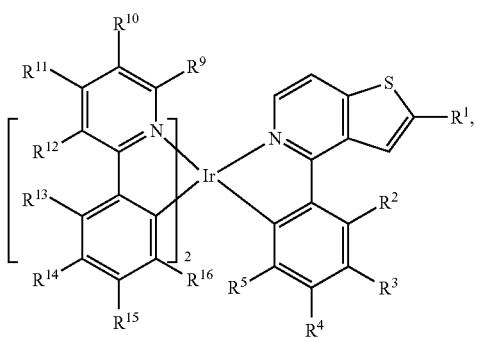

wherein $R^1$ is hydrogen, deuterium, $C_{1-6}$ alkyl group, $C_{1-6}$ deuterated alkyl group, $C_{3-12}$ heteroaryl group or $C_{6-12}$ aryl group; $R^2$, $R^3$, $R^4$ and $R^5$ are independently hydrogen, halogen, $C_{1-6}$ alkyl group, $C_{1-6}$ alkoxy group, $C_{1-6}$ fluoroalkyl group, $C_{3-12}$ heteroaryl group, $C_{6-12}$ aryl group, $C_{7-18}$ alkylaryl group, or $C_{6-12}$ fluoroaryl group; $R^9$, $R^{10}$, $R^{11}$ and $R^{12}$ are independently hydrogen, halogen, deuterium, $C_{1-6}$ alkyl group, $C_{1-6}$ deuterated alkyl group, $C_{1-6}$ fluoroalkyl group, or two adjacent groups of $R^9$, $R^{10}$, $R^{11}$ and $R^{12}$ are optionally combined with the carbon atoms which they are attached to, to form an aryl group or a cycloalkyl group; and $R^{13}$, $R^{14}$, $R^{15}$ and $R^{16}$ are independently hydrogen, halogen, $C_{1-6}$ alkyl group, $C_{1-6}$ fluoroalkyl group, or two adjacent groups of $R^{13}$, $R^{14}$, $R^{15}$ and $R^{16}$ are optionally combined with the carbon atoms which they are attached to, to form an aryl group or a cycloalkyl group. In particular, one of the following two conditions (1) and (2) is met: (1) $R^1$ is deuterium or $C_{1-6}$ deuterated alkyl group, when $R^3$ and $R^4$ are independently hydrogen, halogen, $C_{1-6}$ alkyl group, $C_{1-6}$ alkoxy group, $C_{1-6}$ fluoroalkyl or $C_{3-12}$ heteroaryl group; and (2) $R^1$ is hydrogen, deuterium, $C_{1-6}$ alkyl group, $C_{1-6}$ deuterated alkyl group, $C_{3-12}$ heteroaryl group, or $C_{6-12}$ aryl group, when at least one of $R^3$ and $R^4$ is $C_{6-12}$ aryl group, $C_{7-18}$ alkylaryl group, or $C_{6-12}$ fluoroaryl group.

According to embodiments of the disclosure, the organic metal compound can be

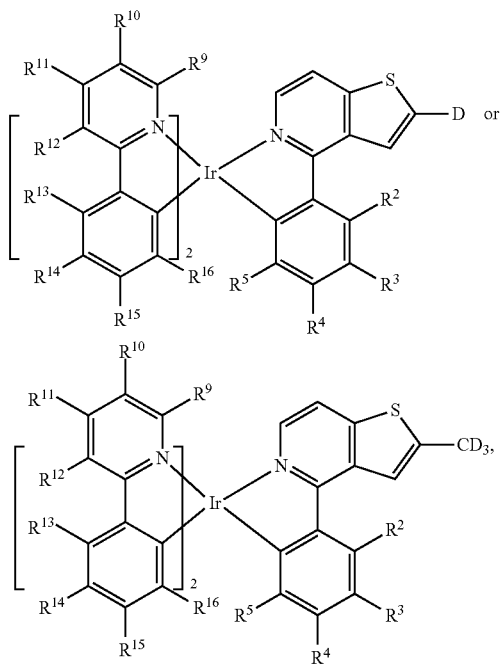

wherein $R^2$, $R^3$, $R^4$ and $R^5$ are independently hydrogen, halogen, $C_{1-6}$ alkyl group, $C_{1-6}$ alkoxy group, $C_{1-6}$ fluoroalkyl group, $C_{3-12}$ heteroaryl group, $C_{6-12}$ aryl group, $C_{7-18}$ alkylaryl group, or $C_{6-12}$ fluoroaryl group; $R^9$, $R^{10}$, $R^{11}$ and $R^{12}$ are independently hydrogen, halogen, deuterium, $C_{1-6}$ alkyl group, $C_{1-6}$ deuterated alkyl group, $C_{1-6}$ fluoroalkyl group, or two adjacent groups of $R^9$, $R^{10}$, $R^{11}$ and $R^{12}$ are optionally combined with the carbon atoms which they are attached to, to form an aryl group or a cycloalkyl group; and $R^{13}$, $R^{14}$, $R^{15}$ and $R^{16}$ are independently hydrogen, halogen, $C_{1-6}$ alkyl group, $C_{1-6}$ fluoroalkyl group, or two adjacent groups of $R^{13}$, $R^{14}$, $R^{15}$ and $R^{16}$ are optionally combined with the carbon atoms which they are attached to, to form an aryl group or a cycloalkyl group.

According to embodiments of the disclosure, the organic metal compound can be

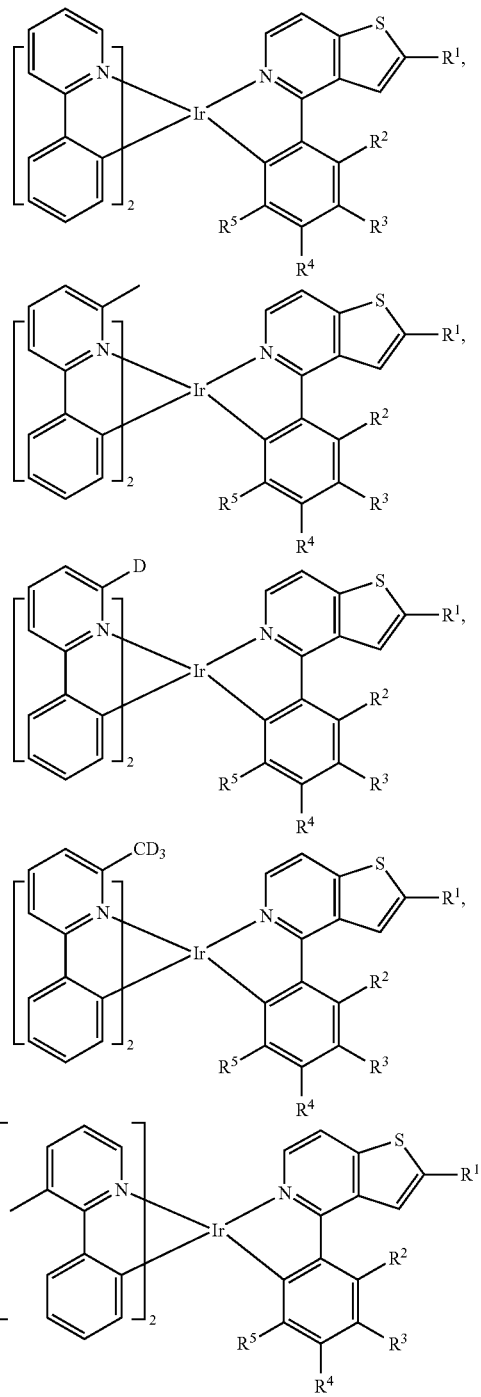

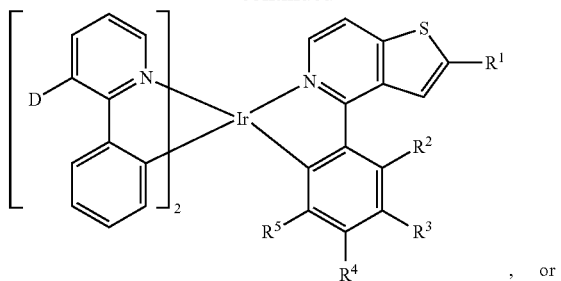

, or

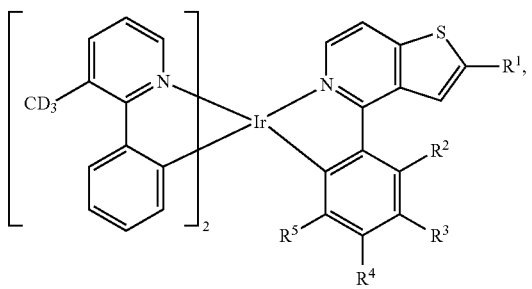

wherein $R^1$ is hydrogen, deuterium, $C_{1-6}$ alkyl group, $C_{1-6}$ deuterated alkyl group, $C_{3-12}$ heteroaryl group or $C_{6-12}$ aryl group; $R^2$, $R^3$, $R^4$ and $R^5$ are independently hydrogen, halogen, $C_{1-6}$ alkyl group, $C_{1-6}$ alkoxy group, $C_{1-6}$ fluoroalkyl group, $C_{3-12}$ heteroaryl group, $C_{6-12}$ aryl group, $C_{7-18}$ alkylaryl group, or $C_{6-12}$ fluoroaryl group. In particular, one of the following two conditions (1) and (2) is met: (1) $R^1$ is deuterium or $C_{1-6}$ deuterated alkyl group, when $R^3$ and $R^4$ are independently hydrogen, halogen, $C_{1-6}$ alkyl group, $C_{1-6}$ alkoxy group, $C_{1-6}$ fluoroalkyl or $C_{3-12}$ heteroaryl group; and (2) $R^1$ is hydrogen, deuterium, $C_{1-6}$ alkyl group, $C_{1-6}$ deuterated alkyl group, $C_{3-12}$ heteroaryl group, or $C_{6-12}$ aryl group, when at least one of $R^3$ and $R^4$ is $C_{6-12}$ aryl group, $C_{7-18}$ alkylaryl group, or $C_{6-12}$ fluoroaryl group.

According to embodiments of the disclosure, the organic metal compound can be

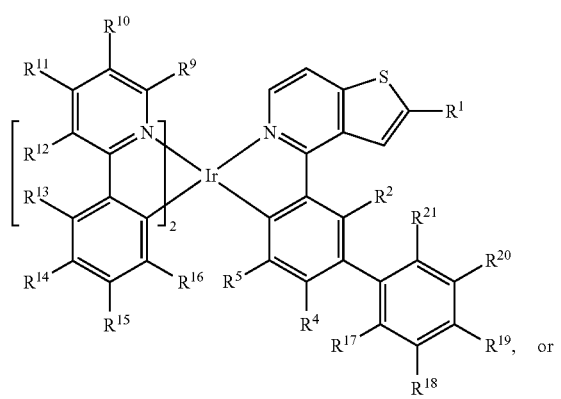

, or

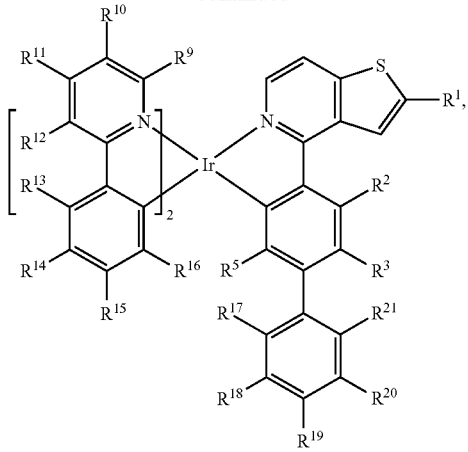

wherein $R^1$ is hydrogen, deuterium, $C_{1-6}$ alkyl group, $C_{1-6}$ deuterated alkyl group, $C_{3-12}$ heteroaryl group or $C_{6-12}$ aryl group; $R^2$, $R^3$, $R^4$ and $R^5$ are independently hydrogen, halogen, $C_{1-6}$ alkyl group, $C_{1-6}$ alkoxy group, $C_{1-6}$ fluoroalkyl group, $C_{3-12}$ heteroaryl group, $C_{6-12}$ aryl group, $C_{7-18}$ alkylaryl group, or $C_{6-12}$ fluoroaryl group; $R^9$, $R^{10}$, $R^{11}$ and $R^{12}$ are independently hydrogen, halogen, deuterium, $C_{1-6}$ alkyl group, $C_{1-6}$ deuterated alkyl group, $C_{1-6}$ fluoroalkyl group, or two adjacent groups of $R^9$, $R^{10}$, $R^{11}$ and $R^{12}$ are optionally combined with the carbon atoms which they are attached to, to form an aryl group or a cycloalkyl group; $R^{13}$, $R^{14}$, $R^{15}$ and $R^{16}$ are independently hydrogen, halogen, $C_{1-6}$ alkyl group, $C_{1-6}$ fluoroalkyl group, or two adjacent groups of $R^{13}$, $R^{14}$, $R^{15}$ and $R^{16}$ are optionally combined with the carbon atoms which they are attached to, to form an aryl group or a cycloalkyl group; and $R^{17}$, $R^{18}$, $R^{19}$, $R^{20}$ and $R^{21}$ are independently hydrogen, fluorine or methyl group.

The organic metal compound of Formula (I) or Formula (II) has furopyridine ligand, thienopyridine ligand, or both. In addition, the organic metal compound of Formula (I) or Formula (II) has a coordinating ligand of phenylpyridine compound or acetylacetonate compound. According to embodiments of the disclosure, a biphenyl group can be further introduced into the furopyridine ligand or thienopyridine ligand of the organic metal compound of the disclosure in order to extend the conjugated system thereof. As a result, the organic light-emitting device employing the organic metal compound of the disclosure can exhibit improved operating lifespan and luminescent efficiency. Furthermore, according to embodiments of the disclosure, in the organic metal compound of the disclosure, hydrogen atoms bonded to the carbon atom of the furopyridine ligand, thienopyridine ligand, or phenylpyridine ligand can be further replaced by deuterium or deuterated alkyl group, thereby enhancing the thermal stability and electrochemical stability. As a result, the operating lifespan of the organic light-emitting device employing the organic metal compound of the disclosure can be improved.

The organic metal compounds having the structure represented by Formula (I) of the disclosure include the following compounds shown in Table 1 and the structures thereof are also shown in Table 1. The maximum wavelength (emission λmax) of photoluminescence (PL) spectra of the organic metal compounds shown in Table 1 was measured, and the results are shown in Table 1.

TABLE 1

| | structure of organic metal compound | maximum PL wavelength (emission λmax) |
|---|---|---|
| Example 1 | Organic metal compound (I) | 550 nm |
| Example 2 | Organic metal compound (II) | 546 nm |
| Example 3 | Organic metal compound (III) | 557 nm |
| Example 4 | Organic metal compound (IV) | 560 nm |
| Example 5 | Organic metal compound (V) | 548 nm |
| Example 6 | Organic metal compound (VI) | 573 nm |
| Example 7 | Organic metal compound (VII) | 557 nm |

In addition, the organic metal compounds having the structure represented by Formula (II) of the disclosure include the following compounds shown in Table 2 and the structures thereof are also shown in Table 2. The maximum wavelength (emission λmax) of photoluminescence (PL) spectra of the organic metal compounds shown in Table 2 was measured, and the results are shown in Table 2.

TABLE 2

| | structure of organic metal compound | maximum PL wavelength (emission λmax) |
|---|---|---|
| Example 8 | Organic metal compound (VIII) | 541 nm |
| Example 9 | Organic metal compound (IX) | 542 nm |
| Example 10 | Organic metal compound (X) | 543 nm |
| Example 11 | Organic metal compound (XI) | 535 nm |

TABLE 2-continued
| | structure of organic metal compound | maximum PL wavelength (emission λmax) |
|---|---|---|
| Example 12 | 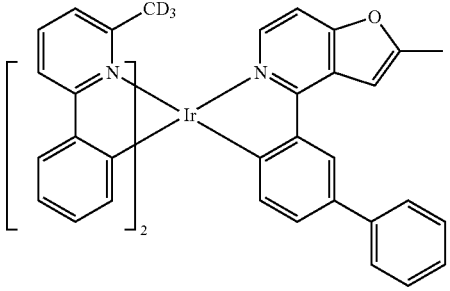<br>Organic metal compound (XII) | 533 nm |
| Example 13 | 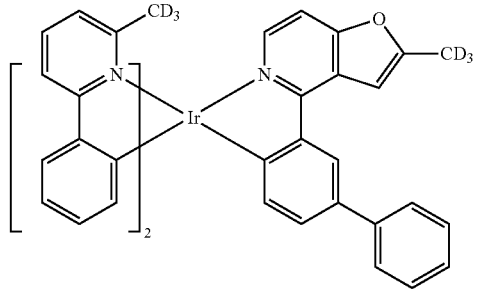<br>Organic metal compound (XIII) | 532 nm |
| Example 14 | 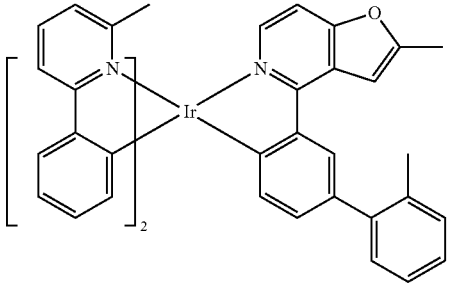<br>Organic metal compound (XIV) | 531 nm |
| Example 15 | 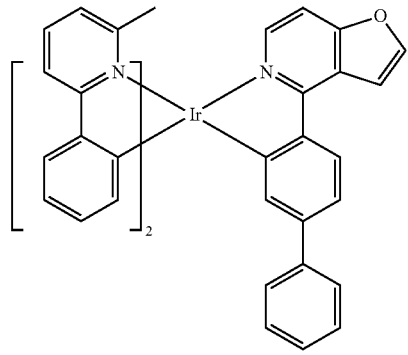<br>Organic metal compound (XV) | 558 nm |

TABLE 2-continued
| | structure of organic metal compound | maximum PL wavelength (emission λmax) |
|---|---|---|
| Example 16 | 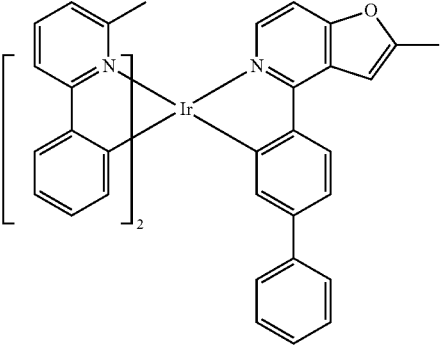<br>Organic metal compound (XVI) | 552 nm |
| Example 17 | 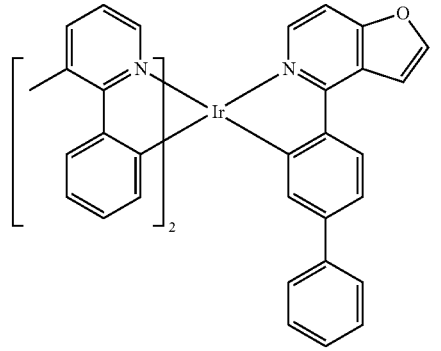<br>Organic metal compound (XVII) | 559 nm |
| Example 18 | 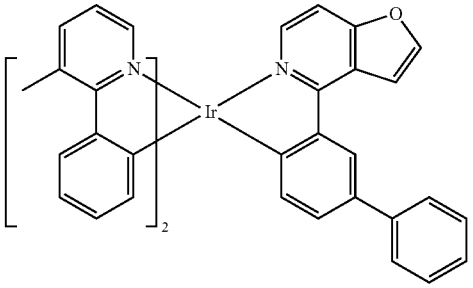<br>Organic metal compound (XIII) | 550 nm |
| Example 19 | 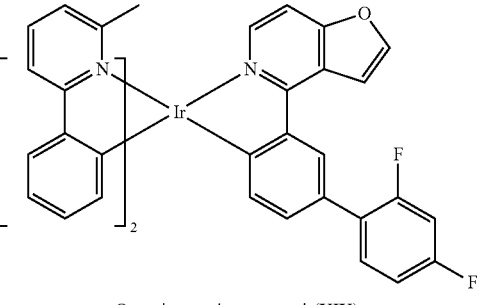<br>Organic metal compound (XIX) | 538 nm |

TABLE 2-continued

| | structure of organic metal compound | maximum PL wavelength (emission λmax) |
|---|---|---|
| Example 20 | Organic metal compound (XX) | 529 nm |
| Example 21 | Organic metal compound (XXI) | 557 nm |
| Example 22 | Organic metal compound (XXII) | 571 nm |

The organic metal compound of the disclosure was dissolved into $CH_2Cl_2$ respectively obtaining solutions with a concentration of $10^{-5}$ M. Next, the photoluminescence (PL) spectra and the maximum PL wavelength (Emission λmax) of the solutions were measured. As shown in Table 1 and Table 2, the organic metal compounds having the structure represented by Formula (I) or Formula (II) of the disclosure have a maximum PL wavelength between 529 nm and 573 nm. Thus, the organic metal compounds having the structure represented by Formula (I) or Formula (II) of the disclosure can serve as green phosphorescent materials.

In order to clearly illustrate the method for preparing the organic metal compound of the disclosure, the preparation of compounds disclosed in Examples 1-4, 6, 7, 11, and 15-22 are described in detail below.

Preparation of Organic Metal Compound (I)

Furan-2-carbaldehyde (48 g, 500 mmol), malonic acid (78.04 g, 750 mmol), pyridine (23 g), and catalytic amount of piperidine were added into a reaction bottle, and the mixture was heated to reflux (about 90° C.) under nitrogen atmosphere. After reacting for 3 hr, the result was added into methanol (100 ml), and the solution was cooled to room temperature. After sufficiently stirring, the result was added into water. After precipitation and filtration, Compound (1) was obtained. The synthesis pathway of the above reaction was as follows:

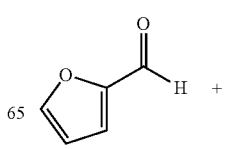

-continued

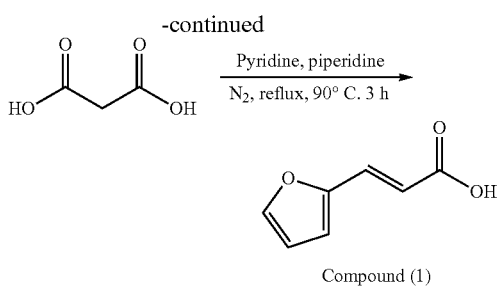

Compound (1)

Next, Compound (1) (55.93 g, 405 mmol) and dichloromethane (DCM) (405 ml) were added into a reaction bottle. Next, oxalyl chloride (66.7 g, 526 mmol) was added slowly into the result. After the addition of oxalyl chloride was complete, a catalytic amount of dimethylformamide (DMF) was added into the reaction bottle. After reacting at room temperature for 2 hr, the solvent of the result was removed by vacuum, and acetone was added into the reaction bottle. After cooling to 0° C., sodium azide (NaN₃) (52.6 g, 809 mmol) aqueous solution was added into the reaction bottle. After reacting for 16 hr, water was added into the reaction bottle. After filtration, Compound (2) was obtained. The synthesis pathway of the above reaction was as follows:

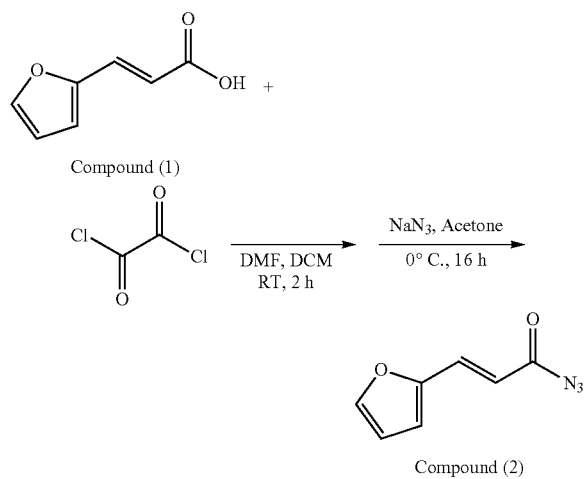

Compound (2)

Next, tri-n-butylamine ((nBu)₃N) (41.3 ml, 500 mmol) and diphenyl ether (21.7 ml) were added into a reaction bottle. Next, after heating the reaction bottle to 230° C., Compound (2) (40.8 g, 250 mmol) (dissolved in 217 ml of diphenyl ether) was slowly added into the reaction bottle. After reacting for half hour, n-hexane was added into the reaction bottle. After filtrating and collecting the solid, Compound (3) was obtained. The synthesis pathway of the above reaction was as follows:

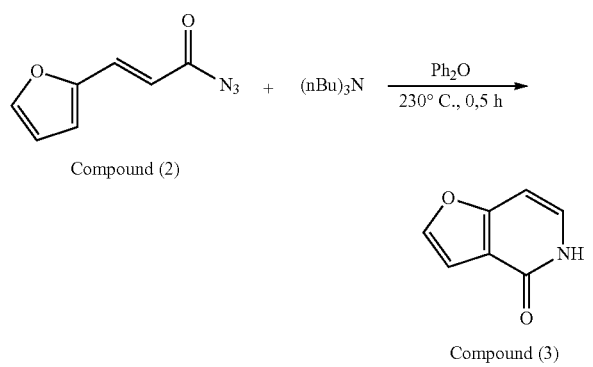

Compound (3)

Next, Compound (3) (60.0 g, 444 mmol) and phosphorus oxychloride (POCl₃) (62 mL, 666 mmol) were added into a reaction bottle. After heating the reaction bottle to 120-140° C. for 2.5 hours, the reaction bottle was cooled to 25° C. The reaction was quenched by water under ice bath. Next, the reaction mixture was neutralized with sodium hydroxide. The mixture was extracted with ethyl acetate (EA) and water. Next, an organic phase was separated and concentrated. Next, after removing water and concentrating, the result was purified by column chromatography. Compound (4) was obtained. The synthesis pathway of the above reaction was as follows:

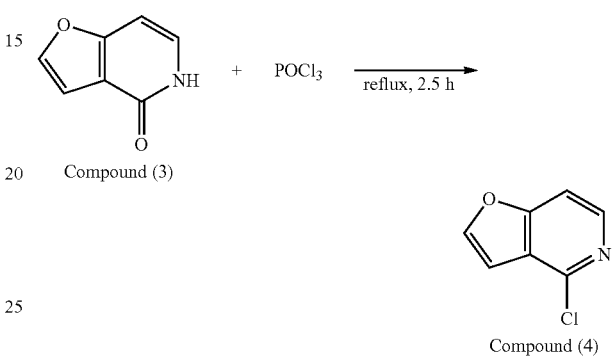

Compound (4)

Next, Compound (4) (3.52 g, 23.0 mmol), 3-phenylboronic acid (5.0 g, 25.2 mmol), bis(dibenzylideneacetone) palladium (Pd(dba)₂) (66.0 mg, 0.11 mmol), tri-tert-butylphosphine tetrafluoroborate ([P(tBu)₃]HBF₄) (67.0 mg, 0.23 mmol), sodium bicarbonate (9.7 g, 91.7 mmol), ethanol (36 ml) and water (12 ml) were added into a reaction bottle, and the reaction bottle was heated to reflux for 18 hr. Next, after cooling the reaction bottle to room temperature, the result was purified by column chromatography, and Compound (5) was obtained. The synthesis pathway of the above reaction was as follows:

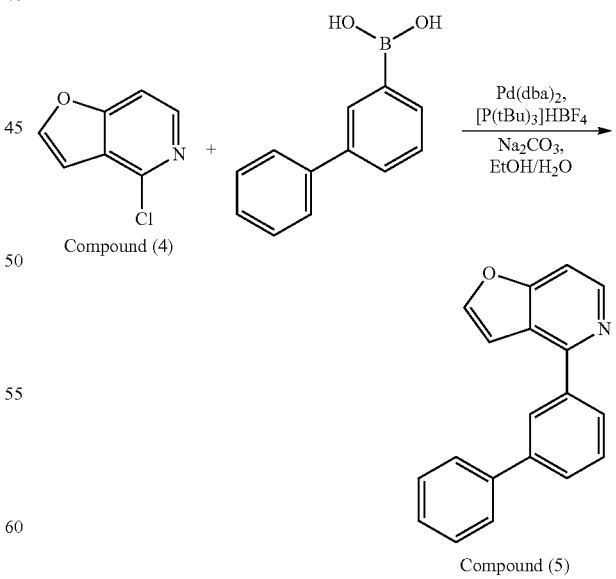

Compound (5)

Next, Compound (5) (1 g, 3.69 mmol), iridium trichloride (IrCl₃) (550 mg, 1.84 mmol), 2-methoxyethanol (15 ml), and water (5 ml) were added into a reaction bottle. Next, after removing moisture and oxygen and purging nitrogen gas several times, the result was heated to reflux. After reacting for 24 hr, the result was cooled to room temperature. After adding water to precipitate a solid, the solid was washed with water and methanol after filtration. After drying by vacuum, Compound (6) was obtained. The synthesis pathway of the above reaction was as follows:

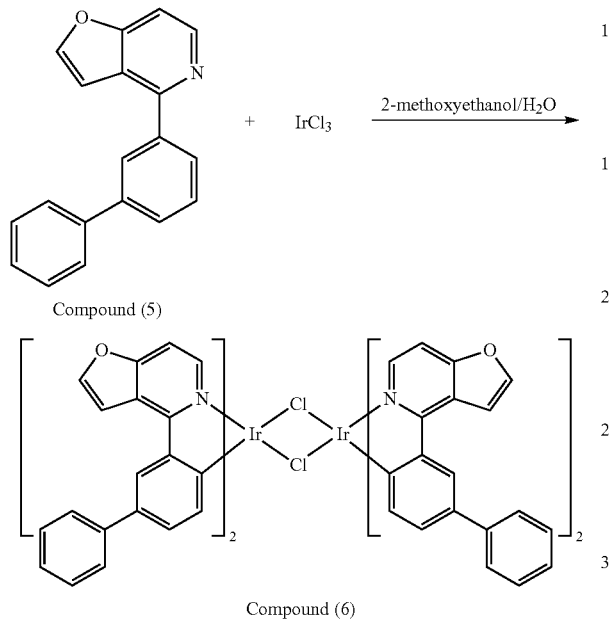

Compound (5)

Compound (6)

Next, Compound (6) (1.18 g, 0.77 mmol), acetylacetone (308 mg, 3.07 mmol), sodium carbonate (325 mg, 3.07 mmol) and 2-methoxyethanol (15 ml) were added into a reaction bottle. Next, after removing moisture and oxygen and purging nitrogen gas several times, the reaction bottle was heated to 130° C. After reacting for 18 hr, the result was cooled to room temperature. After adding water to precipitate a solid, the result was filtrated and the filter cake was washed with water and n-hexane, and the solid was dissolved in dichloromethane (CH$_2$Cl$_2$). Next, the result was extracted three times using dichloromethane (CH$_2$Cl$_2$) and water as the extraction solvent, and an organic phase was separated and concentrated. Finally, the result was purified by column chromatography, and Organic metal compound (I) was obtained. The synthesis pathway of the above reaction was as follows:

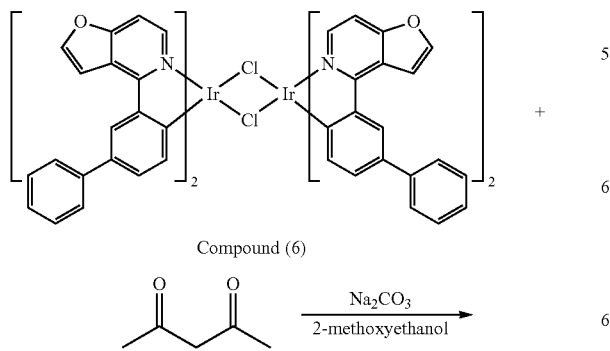

Compound (6)

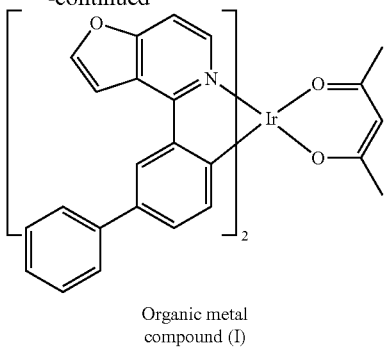

Organic metal compound (I)

Preparation of Organic Metal Compound (II)

Compound (7) was prepared in the same manner as Compound (6) except that furan-2-carbaldehyde (500 mmol) was replaced by 5-methylfurfuran (500 mmol).

Compound (7) (0.612 mmole), acetylacetone (2.47 mmole), potassium carbonate (2.47 mmole), and 2-methoxyethanol (6.1 ml) were added into the reaction bottle. Next, after removing moisture and oxygen and purging nitrogen gas several times, and the reaction bottle was heated to 130° C. After reacting for 18 hr, the result was cooled to room temperature. After adding water to precipitate a solid, the result was filtrated and the filter cake was washed with water and n-hexane, and the solid was dissolved in dichloromethane (CH$_2$Cl$_2$). Next, the result was extracted three times using dichloromethane (CH$_2$Cl$_2$) and water as the extraction solvent, and an organic phase was separated and concentrated. Finally, the result was purified by column chromatography. Organic metal compound (II) was obtained. The synthesis pathway of the above reaction was as follows:

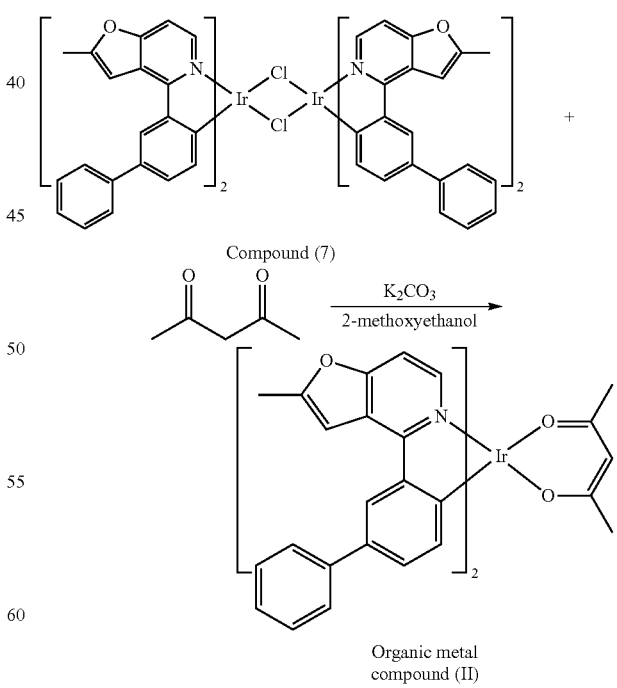

Compound (7)

Organic metal compound (II)

Preparation of Organic Metal Compound (III)

Compound (8) was prepared in the same manner as Compound (7) except that 3-phenylboronic acid (25.2 mmol) was replaced by 4-phenylboronic acid (25.2 mmol).

Compound (8) (0.703 mmole), acetylacetone (2.81 mmole), potassium carbonate (2.81 mmole), and 2-methoxyethanol (7.0 ml) were added into a reaction bottle. Next, after removing moisture and oxygen and purging nitrogen gas several times, and the reaction bottle was heated to 130° C. After reacting for 18 hr, the result was cooled to room temperature. After adding water to precipitate a solid, the result was filtrated and the filter cake was washed with water and n-hexane, and the solid was dissolved in dichloromethane ($CH_2Cl_2$). Next, the result was extracted three times using dichloromethane ($CH_2Cl_2$) and water as the extraction solvent, and an organic phase was separated and concentrated. Finally, the result was purified by column chromatography. Organic metal compound (III) was obtained. The synthesis pathway of the above reaction was as follows:

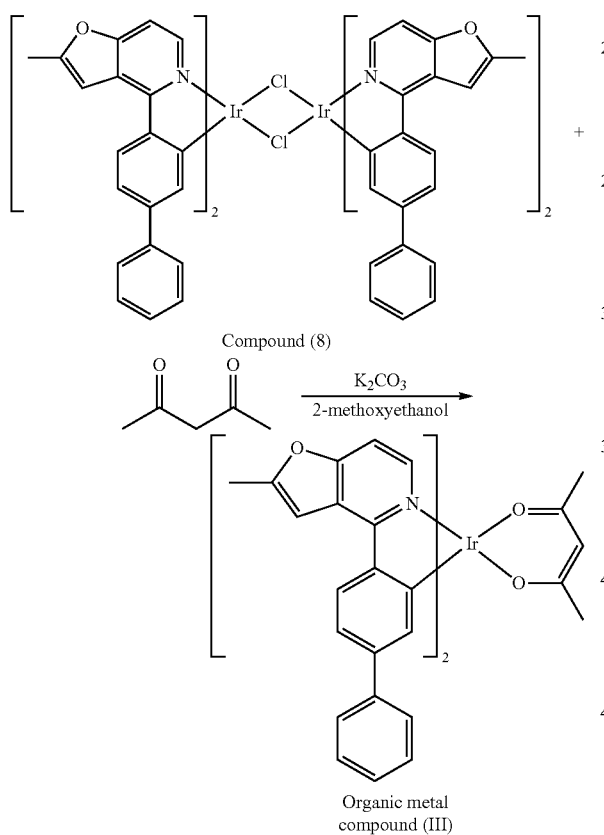

Preparation of Organic Metal Compound (IV)

Compound (9) was prepared in the same manner as Compound (6) except that 3-phenylboronic acid (25.2 mmol) was replaced by 4-phenylboronic acid (25.2 mmol).

Compound (9) (0.536 mmole), acetylacetone (2.14 mmole), potassium carbonate (2.14 mmole) and 2-methoxyethanol (7.0 ml) were added into a reaction bottle. Next, after removing moisture and oxygen and purging nitrogen gas several times, and the reaction bottle was heated to 130° C. After reacting for 18 hr, the result was cooled to room temperature. After adding water to precipitate a solid, the result was filtrated and the filter cake was washed with water and n-hexane, and the solid was dissolved in dichloromethane ($CH_2Cl_2$). Next, the result was extracted three times using dichloromethane ($CH_2Cl_2$) and water as the extraction solvent, and an organic phase was separated and concentrated. Finally, the result was purified by column chromatography. Organic metal compound (IV) was obtained. The synthesis pathway of the above reaction was as follows:

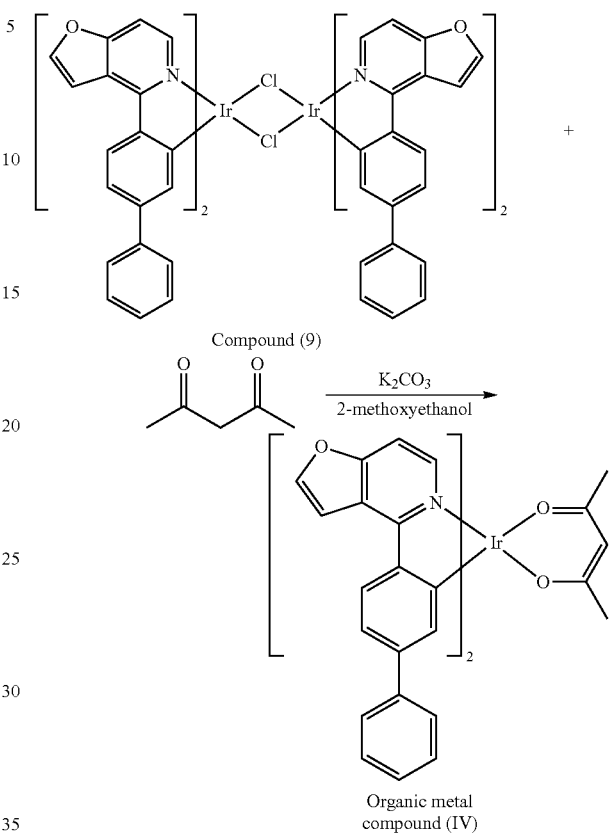

Preparation of Organic Metal Compound (VI)

First, 2-thiophenecarboxaldehyde (10 g, 89.17 mmol), propanedioic acid (13.92 g, 133.77 mmol) and pyridine (4.3 mL) were added into a reaction bottle. Next, piperidine (8.9 mL) was added into the reaction bottle and the reaction bottle was heated at 120° C. for 2 hr. Next, methanol (1.8 mL) was added into the reaction bottle after cooling to room temperature. After sufficiently stirring, the result was added into water. After precipitation and filtration, Compound (1') was obtained. The synthesis pathway of the above reaction was as follows:

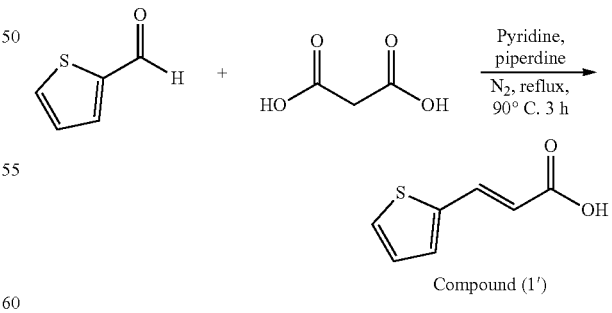

Next, Compound (1') (8 g, 51.89 mmol) and dichloromethane (DCM) (52 ml) were added into a reaction bottle. Next, oxalyl chloride (5.79 mL, 67.5 mmol) was added slowly into the result. After reacting for 3 hr, the solvent of the result was removed by vacuum, and Compound (2') was obtained. The synthesis pathway of the above reaction was as follows:

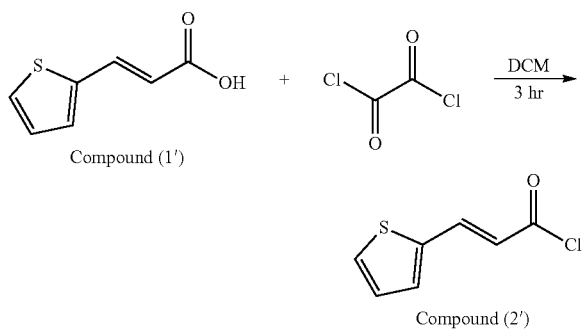

Compound (1')    Compound (2')

Next, Compound (2') (8.96 g, 51.89 mmol) was dissolved in acetone (521 mL). After cooling to 0° C., sodium azide (NaN₃) (6.75 g, 103.83 mmol) aqueous solution was added into the reaction bottle. After reacting for 8 hr, water was added into the reaction bottle. After filtration, Compound (3') was obtained. The synthesis pathway of the above reaction was as follows:

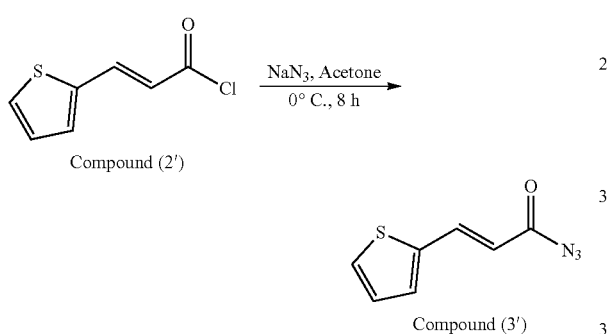

Next, tri-n-butylamine ((nBu)₃N) (7.2 g, 38.84 mmol) and diphenyl ether (24 mL) were added into a reaction bottle. Next, after heating the reaction bottle to 190° C., Compound (3') (8.7 g, 48.55 mmol) (dissolved in 24 ml of diphenyl ether) was slowly added into the reaction bottle. After reacting for 2 hour, n-hexane (20 mL) was added into the reaction bottle. After filtrating and collecting the solid, Compound (4') was obtained. The synthesis pathway of the above reaction was as follows:

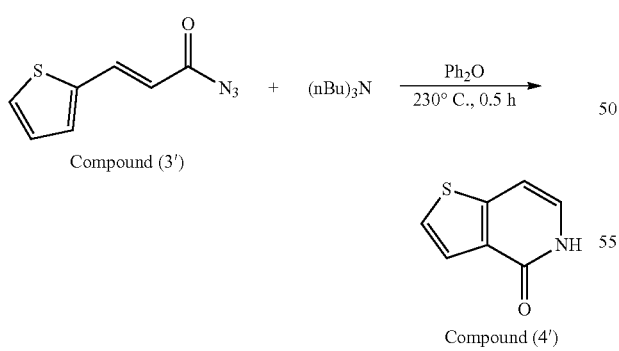

Next, Compound (4') (6.1 g, 40.35 mmol), acetonitrile (40 mL) and phosphorus oxychloride (POCl₃) (5.55 mL, 59.72 mmol) were added into a reaction bottle. After heating the reaction bottle to 80° C. for 4 hours, the reaction bottle was cooled to 25° C. The reaction was quenched by water under ice bath. Next, ethyl acetate (EA) was added into the reaction bottle, and then the reaction mixture was neutralized with sodium hydroxide (11 g). The mixture was extracted with ethyl acetate (EA) and water. Next, an organic phase was separated and concentrated. Next, after removing water and concentrating, the result was purified by column chromatography. Compound (5') was obtained. The synthesis pathway of the above reaction was as follows:

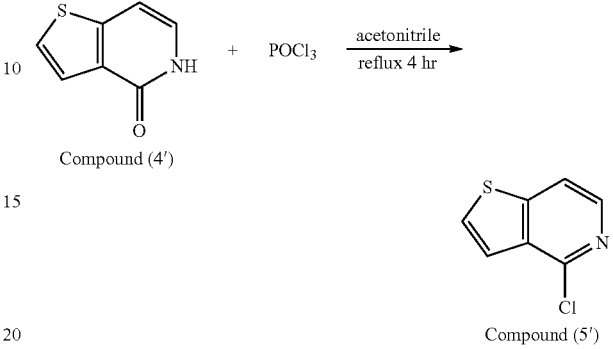

Next, Compound (5') (2 g, 11.79 mmol), 4-biphenylboronic acid (3.5 g, 17.67 mmol), bis(dibenzylideneacetone) palladium (Pd(dba)₂) (0.102 g, 0.17 mmol), tri-tert-butylphosphine tetrafluoroborate ([P(tBu)₃]HBF₄) (0.103 g, 0.35 mmol), potassium carbonate (5 g, 36.17 mmol), ethanol (36 ml) and water (12 ml) were added into a reaction bottle, and the reaction bottle was heated to reflux for 18 hr. Next, after cooling the reaction bottle to room temperature, the result was purified by column chromatography, and Compound (23) was obtained. The synthesis pathway of the above reaction was as follows:

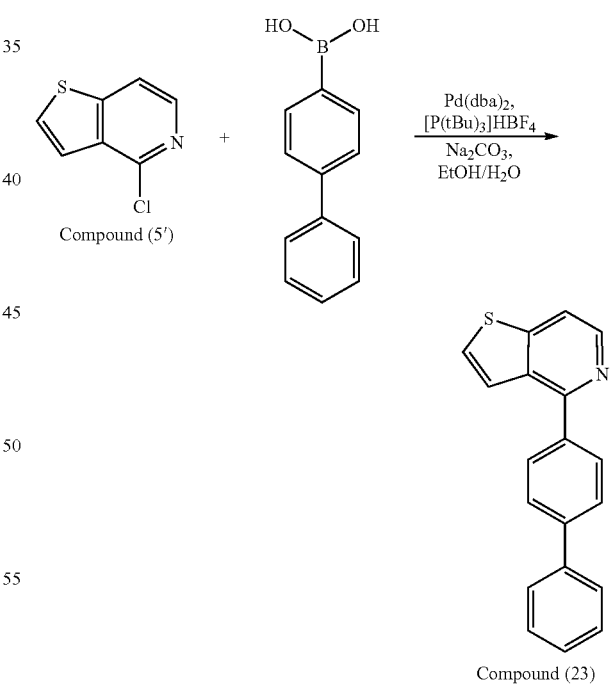

Next, Compound (23) (0.5 g, 1.74 mmol), iridium trichloride (IrCl₃) (0.236 g, 0.79 mmol), 2-methoxyethanol (8 ml), and water (2.7 ml) were added into a reaction bottle. Next, after removing moisture and oxygen and purging nitrogen gas several times, the result was heated to reflux. After reacting for 24 hr at 130° C., the result was cooled to room temperature. After adding water to precipitate a solid, the solid was washed with water and methanol after filtration.

After drying by vacuum, Compound (10) was obtained. The synthesis pathway of the above reaction was as follows:

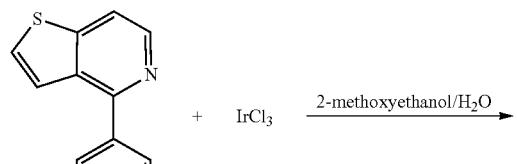

Compound (20)

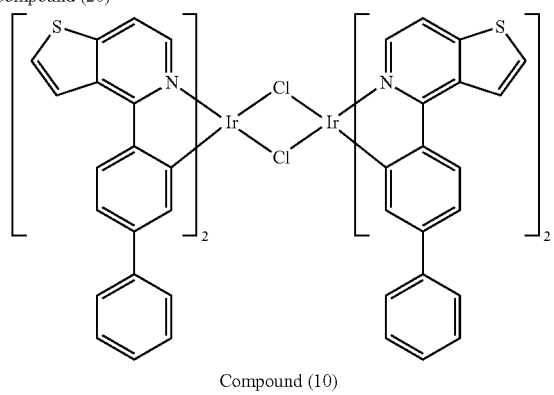

Compound (10)

Compound (10) (0.341 mmole), acetylacetone (2.73 mmole), potassium carbonate (2.73 mmole), and 2-methoxyethanol (3.5 ml) were added into a reaction bottle. Next, after removing moisture and oxygen and purging nitrogen gas several times, and the reaction bottle was heated to 130° C. After reacting for 18 hr, the result was cooled to room temperature. After adding water to precipitate a solid, the result was filtrated and the filter cake was washed with water and n-hexane, and the solid was dissolved in dichloromethane ($CH_2Cl_2$). Next, the result was extracted three times using dichloromethane ($CH_2Cl_2$) and water as the extraction solvent, and an organic phase was separated and concentrated. Finally, the result was purified by column chromatography. Organic metal compound (VI) was obtained. The synthesis pathway of the above reaction was as follows:

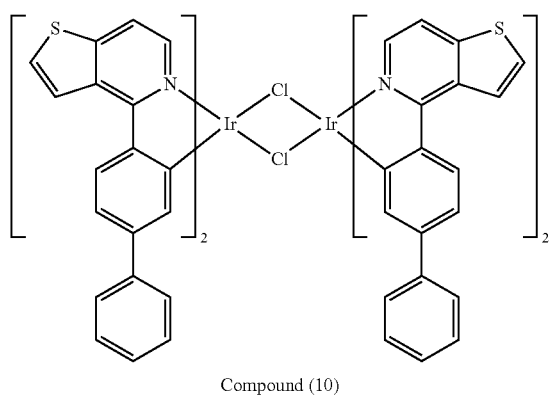

Compound (10)

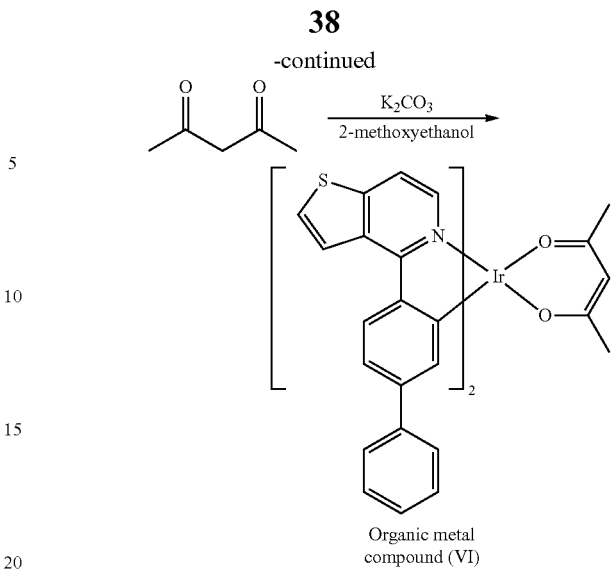

Organic metal compound (VI)

Preparation of Organic Metal Compound (VII)

First, Compound (5') (10 g, 58.95 mmol), phenylboronic acid (10.8 g, 88.58 mmol), $Pd(PPh_3)_4$ (0.681 g, 0.59 mmol), tri-tert-butylphosphine tetrafluoroborate ($[P(tBu)_3]HBF_4$) (0.342 g, 1.18 mmol), potassium carbonate (16.3 g, 117.94 mmol), ethanol (120 ml) and water (120 ml) were added into a reaction bottle, and the reaction bottle was heated to reflux for 18 hr at 110° C. Next, after cooling the reaction bottle to room temperature, the result was purified by column chromatography, and Compound (6') was obtained. The synthesis pathway of the above reaction was as follows:

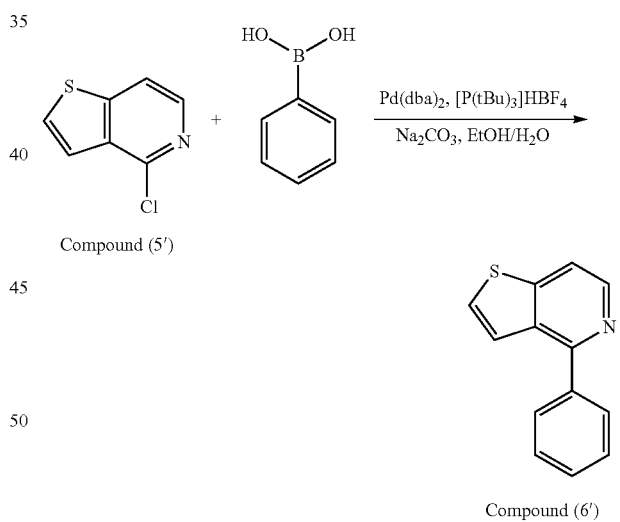

Next, Compound (6') (2 g, 9.47 mmol) and tetrahydrofuran (THF) (100 ml) were added into a reaction bottle. After cooling to −78° C., n-butyllithium (nBuLi) (7.1 mL, 11.36 mmol) was added slowly into the reaction bottle. After stirring for 1 hr, deuterium oxide (10 mL) was added into the reaction bottle. After rising to room temperature and stirring for 8 hr, tetrahydrofuran was removed by vacuum. The result was extracted three times using ethyl acetate (EA) and water as the extraction solvent, and an organic phase was separated and concentrated. Finally, the result was purified by column chromatography. Compound (7') was obtained. The synthesis pathway of the above reaction was as follows:

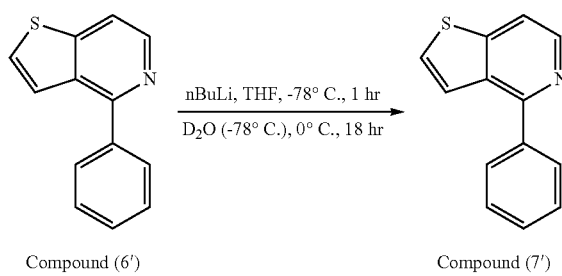

Compound (6')    Compound (7')

Next, Compound (7') (1.84 g, 8.67 mmol), iridium trichloride (IrCl$_3$) (1.23 g, 4.12 mmol), 2-methoxyethanol (42 ml), and water (14 ml) were added into a reaction bottle. Next, after removing moisture and oxygen and purging nitrogen gas several times, the result was heated to reflux. After reacting for 24 hr at 130° C., the result was cooled to room temperature. After adding water (301 mL) to precipitate a solid, the solid was washed with water and methanol after filtration. After drying by vacuum, Compound (11) was obtained. The synthesis pathway of the above reaction was as follows:

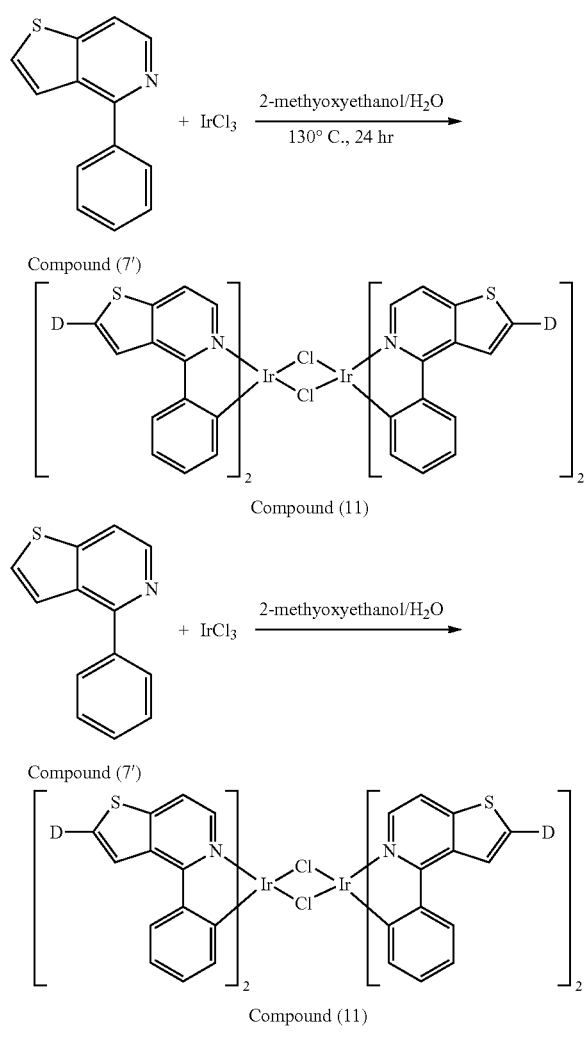

Compound (11) (1.61 mmole), acetylacetone (6.46 mmole), potassium carbonate (3.22 mmole) and 2-methoxy-ethanol (16 ml) were added into a reaction bottle. Next, after removing moisture and oxygen and purging nitrogen gas several times, and the reaction bottle was heated to 130° C. After reacting for 18 hr, the result was cooled to room temperature. After adding water to precipitate a solid, the result was filtrated and the filter cake was washed with water and n-hexane, and the solid was dissolved in dichloromethane (CH$_2$Cl$_2$). Next, the result was extracted three times using dichloromethane (CH$_2$Cl$_2$) and water as the extraction solvent, and an organic phase was separated and concentrated. Finally, the result was purified by column chromatography. Organic metal compound (VII) was obtained. The synthesis pathway of the above reaction was as follows:

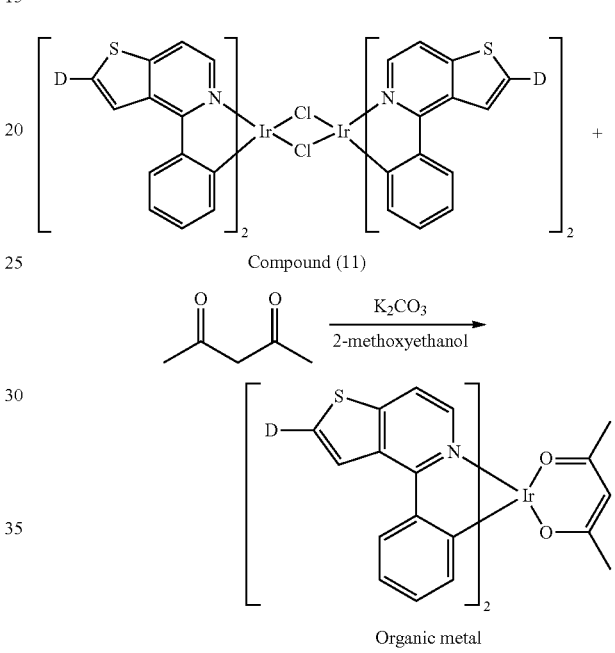

Preparation of Organic Metal Compound (XI)

2-methyl-6-phenylpyridine (mPPy) (16.7 g, 56.0 mmole), iridium trichloride (IrCl$_3$) (118.0 mmole), 2-methoxyethanol (420 ml) and water (140 ml) were added into a reaction bottle. Next, after removing moisture and oxygen and purging nitrogen gas several times, the result was heated to reflux. After reacting for 24 hr, the result was cooled to room temperature. After adding water to precipitate a solid, the solid was washed with water and methanol after filtration. After drying by vacuum, Compound (12) was obtained. The synthesis pathway of the above reaction was as follows:

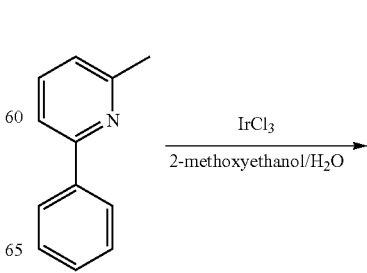

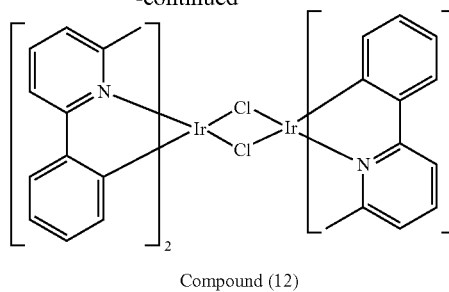

Compound (12)

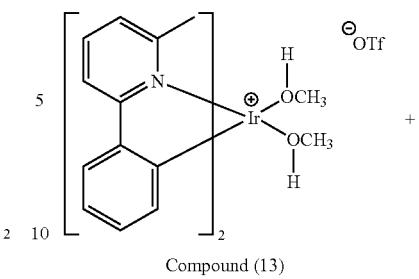

Compound (13)

Compound (12) (14.2 mmol) and dichloromethane (CH$_2$Cl$_2$) (142 ml) were added into a first reaction bottle. Silver trifluoromethanesulfonate (AgOTf) (31.2 mmol) and methanol (156 ml) were added into a second reaction bottle, obtaining a solution. The solution was added into the first reaction bottle, and the result was stirred at room temperature for 18 hr. After filtrating for removing sliver chloride and followed by concentrating, Compound (13) was obtained. The synthesis pathway of the above reaction was as follows:

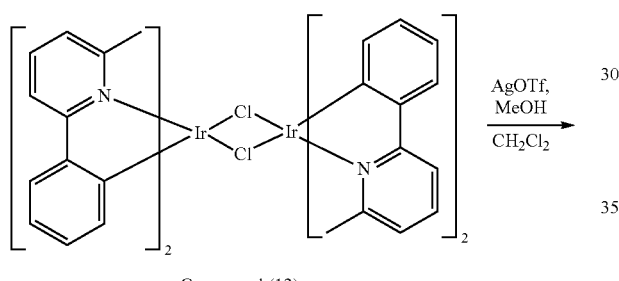

Compound (12)

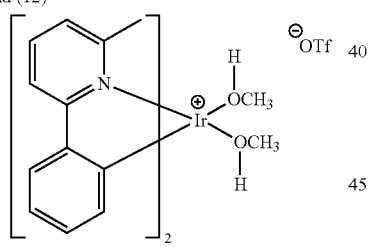

Compound (13)

Next, Compound (13) (11.4 mmol), Compound (14) (17.2 mmol), methanol (60 ml) and ethanol (60 ml) were added into a reaction bottle. After removing moisture and oxygen and purging nitrogen gas several times, the reaction bottle was heated to 90° C. After reacting for 18 hr, the result was cooled to room temperature. After adding water to precipitate a solid, the result was filtrated and the filter cake was washed with water and n-hexane, and the solid was dissolved in dichloromethane (CH$_2$Cl$_2$). Next, the result was extracted three times using dichloromethane (CH$_2$Cl$_2$) and water as the extraction solvent, and an organic phase was separated and concentrated. Finally, the result was purified by column chromatography. Organic metal compound (XI) was obtained. The synthesis pathway of the above reaction was as follows:

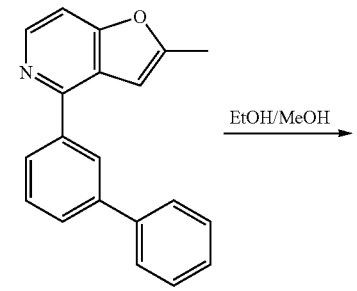

Compound (14)

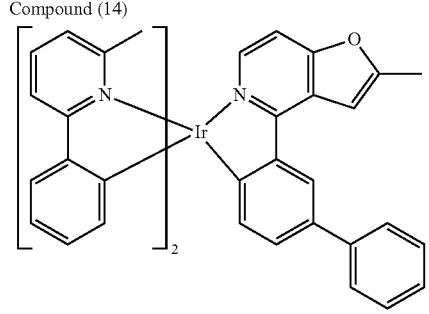

Organic metal compound (XI)

Preparation of Organic Metal Compound (XV)

Compound (13) (1.91 mmol), Compound (15) (2.87 mmol), methanol (10 ml) and ethanol (10 ml) were added into a reaction bottle. Next, after removing moisture and oxygen and purging nitrogen gas several times, the reaction bottle was heated to 90° C. After reacting for 18 hr, the result was cooled to room temperature. After adding water to precipitate a solid, the result was filtrated and the filter cake was washed with water and n-hexane, and the solid was dissolved in dichloromethane (CH$_2$Cl$_2$). Next, the result was extracted three times using dichloromethane (CH$_2$Cl$_2$) and water as the extraction solvent, and an organic phase was separated and concentrated. Finally, the result was purified by column chromatography. Organic metal compound (XV) was obtained. The synthesis pathway of the above reaction was as follows:

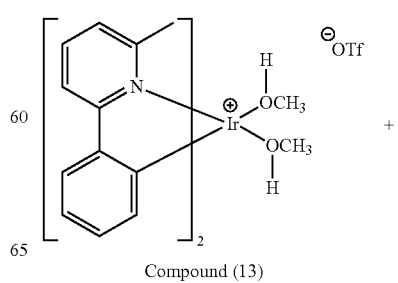

Compound (13)

-continued

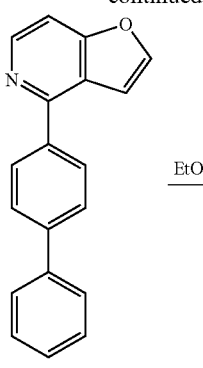

Compound (15)

EtOH/MeOH →

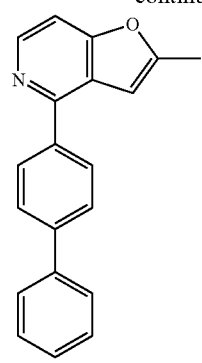

Compound (16)

EtOH/MeOH →

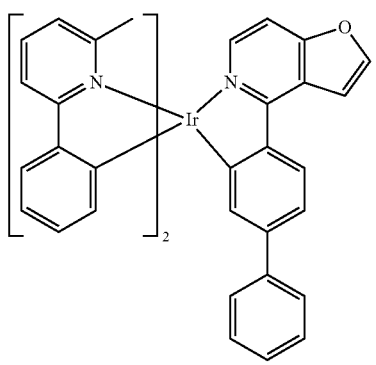

Organic metal
compound (XV)

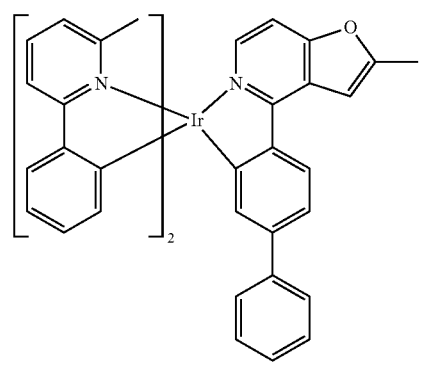

Organic metal
compound (XVI)

Preparation of Organic Metal Compound (XVI)

Compound (13) (1.80 mmol), Compound (16) (2.69 mmol), methanol (9 ml) and ethanol (9 ml) were added into a reaction bottle. Next, after removing moisture and oxygen and purging nitrogen gas several times, and the reaction bottle was heated to 90° C. After reacting for 18 hr, the result was cooled to room temperature. After adding water to precipitate a solid, the result was filtrated and the filter cake was washed with water and n-hexane, and the solid was dissolved in dichloromethane ($CH_2Cl_2$). Next, the result was extracted three times using dichloromethane ($CH_2Cl_2$) and water as the extraction solvent, and an organic phase was separated and concentrated. Finally, the result was purified by column chromatography. Organic metal compound (XVI)) was obtained. The synthesis pathway of the above reaction was as follows:

Preparation of Organic Metal Compound (XVII)

Compound (17) (1.35 mmol), Compound (15) (2.02 mmol), methanol (8 ml), and ethanol (8 ml) were added into a reaction bottle. Next, after removing moisture and oxygen and purging nitrogen gas several times, and the reaction bottle was heated to 90° C. After reacting for 18 hr, the result was cooled to room temperature. After adding water to precipitate a solid, the result was filtrated and the filter cake was washed with water and n-hexane, and the solid was dissolved in dichloromethane ($CH_2Cl_2$). Next, the result was extracted three times using dichloromethane ($CH_2Cl_2$) and water as the extraction solvent, and an organic phase was separated and concentrated. Finally, the result was purified by column chromatography. Organic metal compound (XVII) was obtained. The synthesis pathway of the above reaction was as follows:

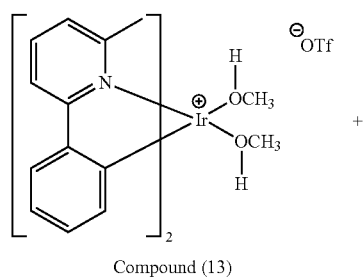

Compound (13)

+

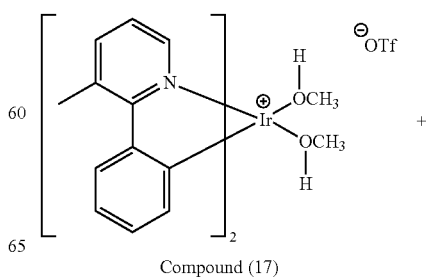

Compound (17)

+

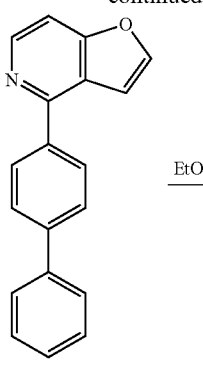

Compound (15)

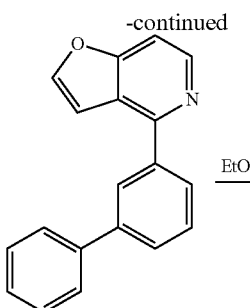

Compound (5)

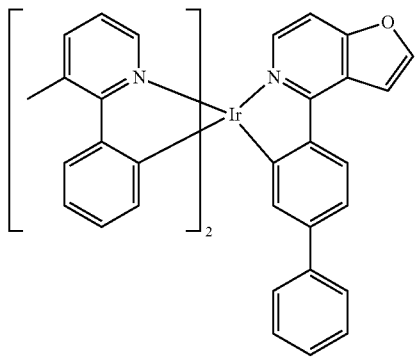

Organic metal compound (XVII)

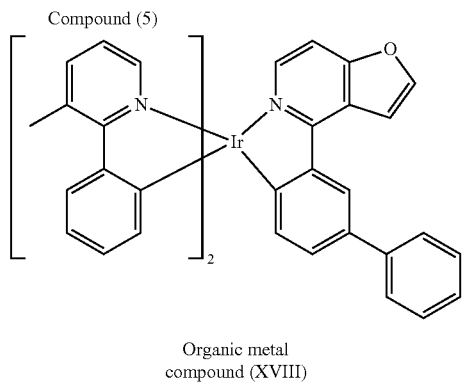

Organic metal compound (XVIII)

Preparation of Organic Metal Compound (XIX)

Compound (13) (0.80 mmol), Compound (18) (1.20 mmol), methanol (4 ml), and ethanol (4 ml) were added into a reaction bottle. Next, after removing moisture and oxygen and purging nitrogen gas several times, and the reaction bottle was heated to 90° C. After reacting for 18 hr, the result was cooled to room temperature. After adding water to precipitate a solid, the result was filtrated and the filter cake was washed with water and n-hexane, and the solid was dissolved in dichloromethane (CH$_2$Cl$_2$). Next, the result was extracted three times using dichloromethane (CH$_2$Cl$_2$) and water as the extraction solvent, and an organic phase was separated and concentrated. Finally, the result was purified by column chromatography. Organic metal compound (XIX) was obtained. The synthesis pathway of the above reaction was as follows:

Preparation of Organic Metal Compound (XXIII)

Compound (17) (1.35 mmol), Compound (5) (2.02 mmol), methanol (8 ml) and ethanol (8 ml) were added into a reaction bottle. Next, after removing moisture and oxygen and purging nitrogen gas several times, and the reaction bottle was heated to 90° C. After reacting for 18 hr, the result was cooled to room temperature. After adding water to precipitate a solid, the result was filtrated and the filter cake was washed with water and n-hexane, and the solid was dissolved in dichloromethane (CH$_2$Cl$_2$). Next, the result was extracted three times using dichloromethane (CH$_2$Cl$_2$) and water as the extraction solvent, and an organic phase was separated and concentrated. Finally, the result was purified by column chromatography. Organic metal compound (XXIII) was obtained. The synthesis pathway of the above reaction was as follows:

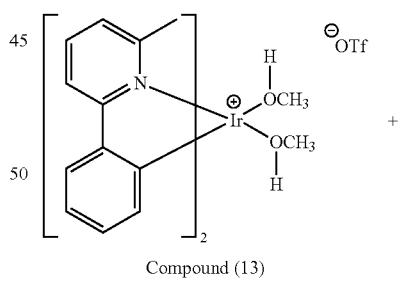

Compound (13)

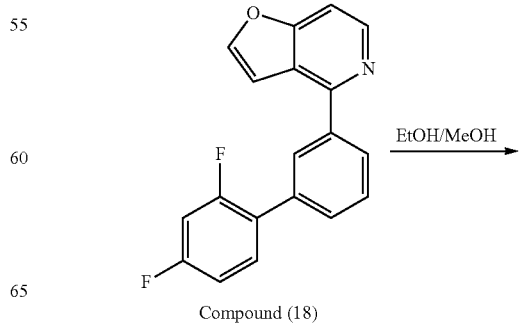

Compound (18)

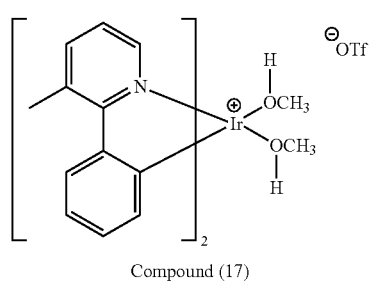

Compound (17)

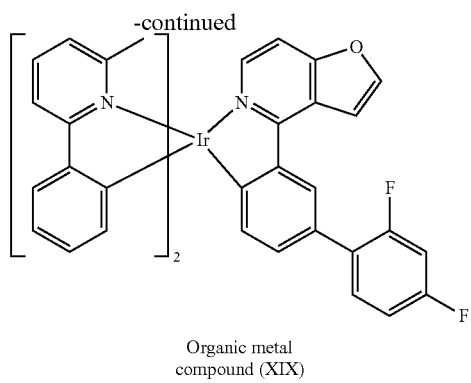

Organic metal
compound (XIX)

Preparation of Organic Metal Compound (XX)

Compound (13) (0.50 mmol), Compound (19) (0.75 mmol), methanol (2.5 ml), and ethanol (2.5 ml) were added into a reaction bottle. Next, after removing moisture and oxygen and purging nitrogen gas several times, and the reaction bottle was heated to 90° C. After reacting for 18 hr, the result was cooled to room temperature. After adding water to precipitate a solid, the result was filtrated and the filter cake was washed with water and n-hexane, and the solid was dissolved in dichloromethane ($CH_2Cl_2$). Next, the result was extracted three times using dichloromethane ($CH_2Cl_2$) and water as the extraction solvent, and an organic phase was separated and concentrated. Finally, the result was purified by column chromatography. Organic metal compound (XX) was obtained. The synthesis pathway of the above reaction was as follows:

Preparation of Organic Metal Compound (XXI)

Compound (13) (1.23 mmol), Compound (20) (1.84 mmol), methanol (6 ml), and ethanol (6 ml) were added into a reaction bottle. Next, after removing moisture and oxygen and purging nitrogen gas several times, and the reaction bottle was heated to 90° C. After reacting for 18 hr, the result was cooled to room temperature. After adding water to precipitate a solid, the result was filtrated and the filter cake was washed with water and n-hexane, and the solid was dissolved in dichloromethane ($CH_2Cl_2$). Next, the result was extracted three times using dichloromethane ($CH_2Cl_2$) and water as the extraction solvent, and an organic phase was separated and concentrated. Finally, the result was purified by column chromatography. Organic metal compound (XXI) was obtained. The synthesis pathway of the above reaction was as follows:

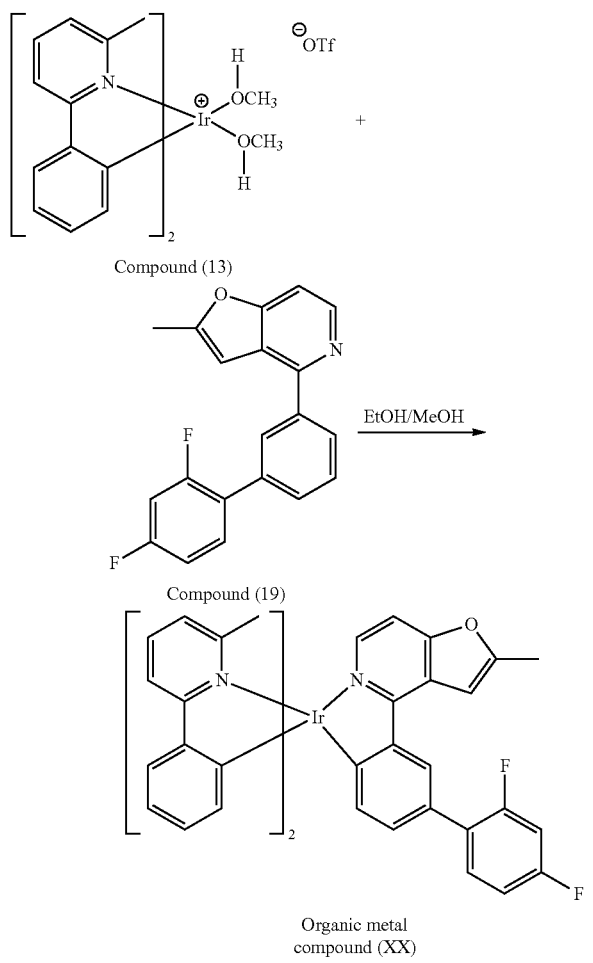

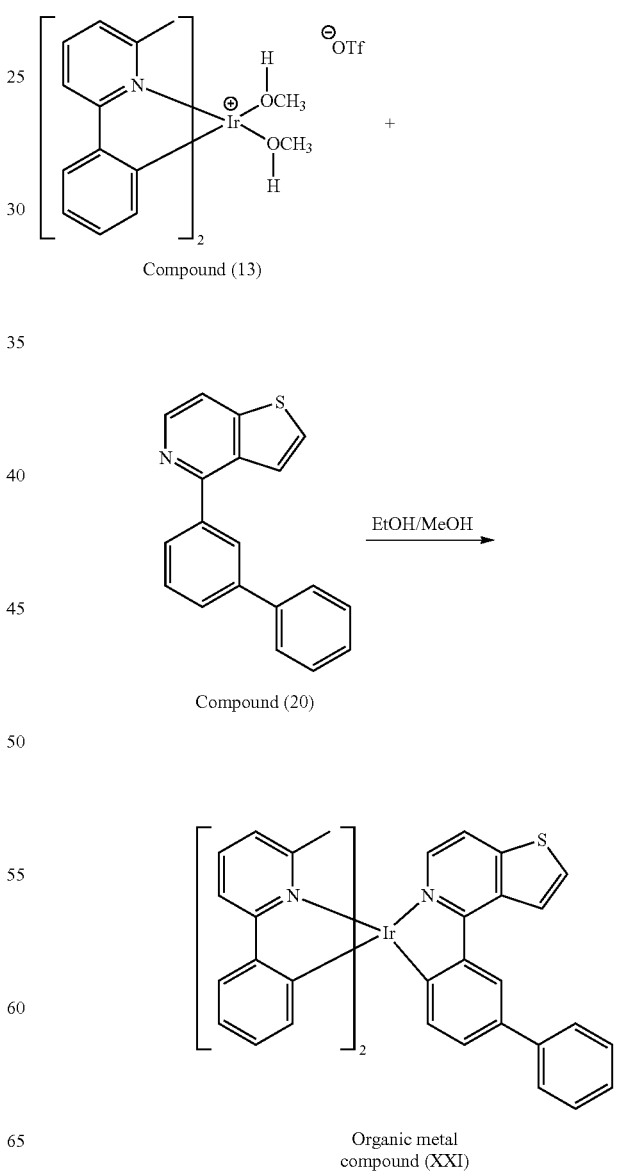

Preparation of Organic Metal Compound (XXII)

Compound (13) (1.59 mmol), Compound (21) (1.91 mmol), methanol (8 ml), and ethanol (8 ml) were added into a reaction bottle. Next, after removing moisture and oxygen and purging nitrogen gas several times, and the reaction bottle was heated to 90° C. After reacting for 18 hr, the result was cooled to room temperature. After adding water to precipitate a solid, the result was filtrated and the filter cake was washed with water and n-hexane, and the solid was dissolved in dichloromethane ($CH_2Cl_2$). Next, the result was extracted three times using dichloromethane ($CH_2Cl_2$) and water as the extraction solvent, and an organic phase was separated and concentrated. Finally, the result was purified by column chromatography. Organic metal compound (XXII)) was obtained. The synthesis pathway of the above reaction was as follows:

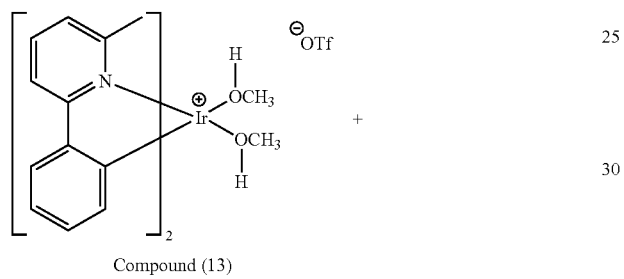

Compound (13)

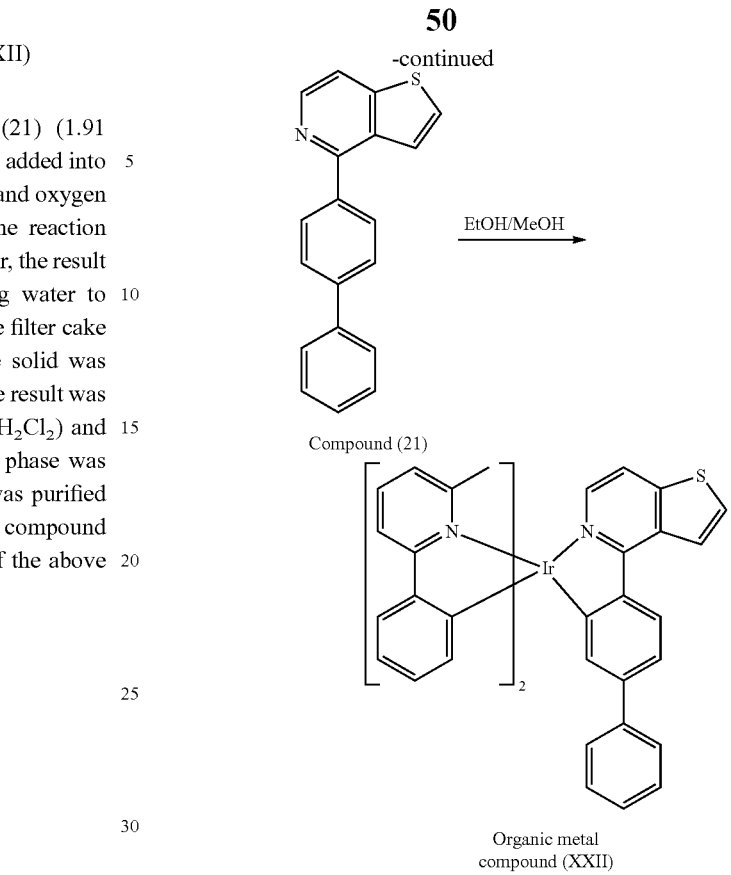

Compound (21)

Organic metal compound (XXII)

Next, the measurement results of nuclear magnetic resonance spectrometry of Organic metal compounds disclosed in Examples 1-22 are shown in Table 3.

TABLE 3

| | Nuclear magnetic resonance spectrum data |
|---|---|
| Organic metal compound (I) | $^1$H NMR (CDCl$_3$, 500 MHz) δ 8.50 (d, 2H), 8.15 (d, 2H), 7.84 (d, 2H), 7.62 (d, 2H), 7.54-7.53 (m, 4H), 7.41-7.35 (m, 6H), 7.26 (d, 2H), 6.93 (d, 2H), 6.40 (d, 2H), 5.25 (s, 1H), 1.81 (s, 6H). |
| Organic metal compound (II) | $^1$H NMR (CDCl$_3$, 500 MHz) δ 8.42 (d, 2H), 8.08 (d, 2H), 7.54 (d. 2H), 7.38 (dd, 4H), 7.30 (d, 2H), 7.28-7.24 (m, 5H), 7.20 (d, 2H), 6.9 (dd, 2H), 6.38 (d, 2H), 5.24 (s, 1H), 2.64 (s, 6H), 1.80 (s, 6H). |
| Organic metal compound (III) | $^1$H NMR (CD$_2$Cl$_2$, 500 MHz) δ 8.41 (d, 2H), 7.93 (d, 2H), 7.34-7.28 (m, 6H), 7.23 (dd, 4H), 7.19-7.15 (m, 4H), 7.13 (d, 2H), 6.49 (s, 2H), 5.28 (s, 1H), 2.62 (s, 6H), 1.79 (s, 6H). |
| Organic metal compound (IV) | $^1$H NMR (CDCl$_3$, 500 MHz) δ 8.46 (d, 2H), 7.94 (d, 2H), 7.78 (d. 2H), 7.52 (d, 2H), 7.34 (d, 2H), 7.27-7.25 (m, 4H), 7.20 (t, 4H), 7.15-7.12 (m, 2H), 7.07 (dd, 2H), 6.05 (d, 2H), 5.20 (s, 1H), 1.80 (s, 6H). |
| Organic metal compound (V) | $^1$H NMR (CDCl$_3$, 500 MHz) δ 8.44 (d, 2H), 7.92 (d, 2H), 7.53 (s, 2H), 7.35 (d, 2H), 6.87 (dd, 2H), 6.66 (dd, 2H), 6.28 (d, 2H), 5.23 (s, 1H), 1.78 (s, 6H). |
| Organic metal compound (VI) | $^1$H NMR (CDCl$_3$, 500 MHz) δ 8.46 (d, 2H), 8.34 (d, 2H), 8.14 (d. 2H), 7.68-7.62 (m, 4H), 7.26-7.22 (d, 7H), 7.18 (m, 4H), 7.14-7.06 (m, 4H), 6.52 (d, 2H), 5.20 (s, 1H), 1.80 (s, 6H). |
| Organic metal compound (VII) | $^1$H NMR (CDCl$_3$, 500 MHz) δ 8.46 (d, 2H), 8.35 (d, 2H), 8.13 (d. 2H), 7.66 (d, 2H), 6.90-6.87 (m, 2H), 6.67-6.64 (m, 2H), 6.32 (d, 2H), 5.23 (s, 1H), 1.78 (s, 6H). |
| Organic metal compound (VIII) | $^1$H NMR (CDCl$_3$, 500 MHz) δ 8.23 (d, 1H), 7.87-7.84 (m, 1H), 7.83-7.81 (m, 1H), 7.74 (d, 1H), 7.71 (d, 1H), 7.68 (d, 1H), 7.64-7.63 (m, 2H), 7.59-7.53 (m, 3H), 7.47-7.44 (m, 1H), 7.42-7.39 (m, 2H), 7.28-7.25 (m, 1H), 7.05 (dd, 1H), 7.02 (d, 1H), 6.93-6.88 (m, 2H), 6.83-6.80 (m, 1H), 6.77-6.74 (m, 2H), 6.72-6.71 (m, 1H), 6.65-6.63 (m, 1H), 6.58 (d, 1H), 6.49 (d, 1H), 2.01 (s, 3H), 1.89 (s, 3H). |
| Organic metal compound (IX) | $^1$H NMR (CDCl$_3$, 500 MHz) δ 8.23 (d, 1H), 7.86 (d, 1H), 7.82 (d, 1H), 7.74 (d, 1H), 7.69 (d, 1H), 7.65-7.63 (m, 2H), 7.60-7.54 (m, 3H), 7.48-7.44 (m, 1H), 7.42-7.39 (m, 2H), 7.29-7.27 (m, 1H), 7.06-7.02 (m, 2H), 6.94-6.89 (m, 2H), 6.83-6.80 (m, 1H), 6.77-6.71 (m, 3H), 6.66-6.63 (m, 1H), 6.58 (d, 1H), 6.49 (d, 1H), 2.03 (s, 3H), 1.90 (s, 3H). |

TABLE 3-continued

| | Nuclear magnetic resonance spectrum data |
|---|---|
| Organic metal compound (X) | $^1$H NMR (CDCl$_3$, 500 MHz) δ 8.23 (d, 1H), 7.87-7.84 (m, 1H), 7.83-7.81 (m, 1H), 7.74 (d, 1H), 7.68 (d, 1H), 7.64-7.63 (m, 2H), 7.59-7.53 (m, 3H), 7.47-7.44 (m, 1H), 7.42-7.39 (m, 2H), 7.28-7.25 (m, 1H), 7.05 (dd, 1H), 7.02 (d, 1H), 6.93-6.88 (m, 2H), 6.83-6.80 (m, 1H), 6.77-6.74 (m, 2H), 6.72-6.71 (m, 1H), 6.65-6.63 (m, 1H), 6.58 (d, 1H), 6.49 (d, 1H), 2.03-1.99 (m, 1H), 1.91-1.87 (m, 1H). |
| Organic metal compound (XI) | $^1$H NMR (CDCl$_3$, 500 MHz) δ 8.17 (d, 1H), 7.85 (d, 1H), 7.81 (d, 1H), 7.73 (d, 1H), 7.65-7.58 (m, 4H), 7.53 (dd, 1H), 7.46-7.40 (m, 3H), 7.28 (d, 1H), 7.15 (s, 1H), 7.03 (dd, 1H), 6.93-6.90 (m, 2H), 6.87 (d, 1H), 6.83-6.79 (m, 1H), 6.77-6.70 (m, 3H), 6.65-6.62 (m, 1H), 6.60-6.58 (m, 1H), 6.49 (dd, 1H), 2.54 (s, 3H), 2.02 (s, 3H), 1.91 (s, 3H). |
| Organic metal compound (XII) | $^1$H NMR (CDCl$_3$, 500 MHz) δ 8.16 (s, 1H), 7.85 (d, 1H), 7.81 (d, 1H), 7.73 (d, 1H), 7.64-7.58 (m, 4H), 7.55-7.52 (m, 1H), 7.46-7.39 (m, 3H), 7.28-7.26 (m, 1H), 7.14 (s, 1H), 7.03 (d, 1H), 6.93-6.87 (m, 3H), 6.82-6.79 (m, 1H), 6.76-6.70 (m, 3H), 6.65-6.62 (m, 1H), 6.58 (d, 1H), 6.48 (d, 1H), 2.53 (s, 3H), 2.01-1.98 (m, 1H), 1.90-1.87 (m, 1H). |
| Organic metal compound (XIII) | $^1$H NMR (CDCl$_3$, 500 MHz) δ 8.17 (s, 1H), 7.85-7.84 (m, 1H), 7.82-7.81 (m, 1H), 7.74 (d, 1H), 7.64-7.58 (m, 4H), 7.56-7.53 (m, 1H), 7.47-7.40 (m, 3H), 7.28-7.26 (m, 1H), 7.14 (s, 1H), 7.03 (d, 1H), 6.92-6.87 (m, 3H), 6.81-6.74 (m, 2H), 6.71-6.62 (m, 3H), 6.56-6.53 (m, 1H), 6.46-6.44 (m, 1H), 2.02-1.98 (m, 1H), 1.90-1.87 (m, 1H). |
| Organic metal compound (XIV) | $^1$H NMR (CDCl$_3$, 500 MHz) δ 7.86-7.85 (m, 2H), 7.82 (d, 1H), 7.73 (d, 1H), 7.61-7.58 (m, 2H), 7.56-7.53 (m, 1H), 7.48-7.45 (m, 1H), 7.33-7.31 (m, 1H), 7.25-7.21 (m, 3H), 7.02 (s, 1H), 6.92-6.88 (m, 3H), 6.83-6.80 (m, 1H), 6.76-6.72 (m, 3H), 6.68-6.65 (m, 2H), 6.60 (d, 1H), 6.51 (d, 1H), 2.47 (s, 3H), 2.31 (s, 3H), 2.02 (s, 3H), 1.91 (s, 3H). |
| Organic metal compound (XV) | $^1$H NMR (CDCl$_3$, 500 MHz) δ 8.02 (d, 1H), 7.85 (d, 1H), 7.88 (d, 1H), 7.83 (d, 1H), 7.75 (d, 1H), 7.69 (d, 1H), 7.66 (d, 1H), 7.59 (d, 1H), 7.55 (t, 1H), 7.50 (d, 1H), 7.43 (t, 1H), 7.34 (d, 2H), 7.28 (t, 2H), 7.22-7.18 (m, 2H), 7.00 (d, 1H), 6.97 (d, 1H), 6.90 (t, 2H), 6.81 (t, 1H), 6.73 (t, 1H), 6.69 (d, 1H), 6.63 (t, 1H), 6.59 (d, 1H), 6.53 (d, 1H), 2.04 (s, 3H), 1.90 (s, 3H). |
| Organic metal compound (XVI) | $^1$H NMR (CDCl$_3$, 500 MHz) δ 7.96 (d, 1H), 7.87 (d, 1H), 7.82 (d, 1H), 7.74 (dd, 1H), 7.59-7.57 (m, 2H), 7.54 (t, 1H), 7.43 (t, 1H), 7.34-7.32 (m, 2H), 7.28-7.25 (m, 3H), 7.19-7.17 (m, 1H), 7.11 (s, 1H), 6.94 (d, 1H), 6.91-6.87 (m, 3H), 6.82-6.78 (m, 1H), 6.72-6.68 (m, 2H), 6.64-6.60 (m, 1H), 6.58 (dd, 1H), 6.52 (dd, 1H), 2.52 (s, 3H), 2.03 (s, 3H), 1.90 (s, 3H). |
| Organic metal compound (XVII) | $^1$H NMR (CDCl$_3$, 500 MHz) δ 8.08 (d, 1H), 7.92 (d, 2H), 7.72 (d, 1H), 7.54 (m, 1H), 7.46 (dd, 1H), 7.42-7.36 (m, 5H), 7.32-7.26 (m, 3H), 7.24-7.18 (m, 2H), 7.12 (d, 1H), 7.04 (dd, 1H), 7.00 (dd, 1H), 6.94-6.86 (m, 3H), 6.84-6.74 (m, 3H), 6.72 (dd, 1H), 2.8 (d, 6H). |
| Organic metal compound (XVIII) | $^1$H NMR (CDCl$_3$, 500 MHz) δ 8.02 (d, 1H), 7.85 (d, 1H), 7.88 (d, 1H), 7.83 (d, 1H), 7.75 (d, 1H), 7.69 (d, 1H), 7.66 (d, 1H), 7.59 (d, 1H), 7.55 (t, 1H), 7.50 (d, 1H), 7.43 (t, 1H), 7.34 (d, 2H), 7.28 (t, 2H), 7.22-7.18 (m, 2H), 7.00 (d, 1H), 6.97 (d, 1H), 6.90 (t, 2H), 6.81 (t, 1H), 6.73 (t, 1H), 6.69 (d, 1H), 6.63 (t, 1H), 6.59 (d, 1H), 6.53 (d, 1H), 2.04 (s, 3H), 1.90 (s, 3H). |
| Organic metal compound (XIX) | $^1$H NMR (CDCl$_3$, 500 MHz) δ 8.22 (s, 1H), 7.88-7.81 (m, 2H), 7.74 (d, 1H), 7.69-7.67 (m, 2H), 7.60-7.43 (m, 5H), 7.03 (d, 1H), 6.93-6.87 (m, 5H), 6.83-6.80 (m, 1H), 6.77-6.72 (m, 3H), 6.67-6.64 (m, 1H), 6.58 (d, 1H), 6.47 (d, 1H), 2.02 (s, 3H), 1.90 (s, 3H). |
| Organic metal compound (XX) | $^1$H NMR (CDCl$_3$, 500 MHz) δ 8.15 (s, 1H), 7.81-7.85 (m, 2H), 7.75 (d, 1H), 7.60-7.59 (m, 2H), 7.56-7.53 (m, 1H), 7.48-42 (m, 2H), 7.08 (s, 1H), 6.93-6.87 (m, 6H), 6.81-6.63 (m, 5H), 6.54-6.52 (m, 1H), 6.44-6.43 (m, 1H), 2.52 (s, 3H), 2.00 (s, 3H), 1.89 (s, 3H). |
| Organic metal compound (XXI) | $^1$H NMR (CDCl$_3$, 500 MHz) δ 8.39(d, 1H), 8.37 (d, 1H), 7.86 (d, 1H), 7.82 (d, 1H), 7.74 (d, 1H), 7.71 (d, 1H), 7.65-7.53 (m, 5H), 7.46 (dd, 1H), 7.4 (dd, 2H), 7.31 (d, 1H), 7.29-7.26 (m, 3H), 7.05 (dd, 1H), 6.94-6.89 (m, 2H), 6.82-6.70 (m, 4H), 6.63 (dd, 1H), 6.56-6.52 (m, 2H), 2.03 (s, 3H), 1.91 (s, 3H). |
| Organic metal compound (XXII) | $^1$H NMR (CDCl$_3$, 500 MHz) δ 8.31 (d, 1H), 8.18 (d, 1H), 7.88 (d, 1H), 7.82 (d, 1H), 7.75 (d, 1H), 7.68 (d, 1H), 7.58-7.54 (m, 3H), 7.44 (dd, 1H), 7.33 (d, 1H), 7.3-7.26 (m, 4H), 7.22-7.18 (m, 2H), 7.00 (d, 1H), 6.91-6.89 (m, 2H), 6.79 (dd, 1H), 6.74-6.68 (m, 2H), 6.62 (dd, 1H), 6.56-6.54 (m, 2H), 2.04 (s, 3H), 1.91 (s, 3H). |

Organic Light-Emitting Device

FIG. 1 shows an embodiment of an organic light-emitting device 10. The organic light-emitting device 10 includes a substrate 12, a bottom electrode 14, an organic light-emitting element 16, and a top electrode 18, as shown in FIG. 1. The organic light-emitting device can be a top-emission, bottom-emission, or dual-emission device. The substrate 12 can be a glass, plastic, or semiconductor substrate. Suitable materials for the bottom and top electrodes can be Ca, Ag, Mg, Al, Li, In, Au, Ni, W, Pt, Cu, indium tin oxide (ITO), indium zinc oxide (IZO), aluminum zinc oxide (AZO), or zinc oxide (ZnO), formed by sputtering, electron beam evaporation, thermal evaporation, or chemical vapor deposition. Furthermore, at least one of the bottom and top electrodes 14 and 18 is transparent.

The organic light-emitting element 16 at least includes an emission layer, and can further include a hole injection layer, a hole transport layer, an electron transport layer, and an electron injection layer. In an embodiment of the disclosure, at least one layer of the organic light-emitting element 16 includes the aforementioned organic metal compound having a chemical structure of Formula (I) or Formula (II).

According to another embodiment of the disclosure, the organic light-emitting device can be a phosphorescent organic light-emitting device (PHOLED), and the emission layer of the organic light-emitting element can include a host material and a phosphorescent dopant, wherein the dopant can include an organic metal compound having a structure of Formula (I) or Formula (II) of the disclosure. The emission layer emits green light under a bias voltage. The dose of the dopant is not limited and can be optionally modified by a person of ordinary skill in the field.

In order to clearly disclose the organic light-emitting devices of the disclosure, the following examples (having an emitting layer employing the organic metal compounds of the disclosure) are intended to illustrate the disclosure more fully without limiting their scope, since numerous modifications and variations will be apparent to those skilled in this art.

Example 23

A glass substrate with a patterned indium tin oxide (ITO) film of 150 nm was provided and then washed with a neutral cleaning agent, acetone, and ethanol with ultrasonic agitation. After drying the substrate with a nitrogen flow, the substrate was subjected to a UV/ozone treatment for 30 minutes. Next, HATCN (hexaazatriphenylene-hexacarbonitrile, with a thickness of 20 nm), a hole transport material (EHT-I-01, commercially available from E-ray optoelectronics Tech Co. Ltd, with a thickness of 150 nm), an electron barrier material (EHT-I-02, commercially available from E-ray optoelectronics Tech Co. Ltd, with a thickness of 10 nm), a luminescent host material (EPH-I-06, commercially available from E-ray optoelectronics Tech Co. Ltd) and a luminescent co-host material (EPH-I-02, commercially available from E-ray optoelectronics Tech Co. Ltd) doped with Organic metal compound (VIII) (serving as a dopant) (the weight ratio of EPH-I-06, EPH-I-02 and Organic metal compound (VIII) is 56%:40%:4%, with a thickness of 60 nm), an electron transport material (ETM-785 (commercially available from E-ray optoelectronics Tech Co. Ltd) and LiQ (8-hydroxy-quinolinato lithium)) (the weight ratio of ETM-785 to LiQ is 1:1, with a thickness of 30 nm) and Al (with a thickness of 120 nm) were subsequently formed on ITO film at $10^{-6}$ torr, obtaining Organic light-emitting device (I) after encapsulation. The materials and layers of Organic light-emitting device (I) are described in the following: ITO/EHT-I-01/EHT-I-02/EPH-I-06: EPH-I-02: Organic metal compound (VIII)/ETM-785: LiQ/Al.

Next, the optical properties (such as voltage, brightness, current efficiency (cd/A) and lifespan (the time before falling to 95% of original brightness (1000 cd/m$^2$) (LT95) and the time before falling to 50% of original brightness (1000 cd/m$^2$) (LT50))) of Organic light-emitting device (I) were measured by a spectra colorimeter and a luminance meter. The results are shown in Table 4.

Example 24

Example 24 was performed in the same manner as in Example 23 except that Organic metal compound (XI) was substituted for Organic metal compound (VIII), obtaining Organic light-emitting device (II). The materials and layers of Organic light-emitting device (II) are described in the following: ITO/EHT-I-01/EHT-I-02/EPH-I-06: EPH-I-02: Organic metal compound (XI)/ETM-785: LiQ/Al.

Next, the optical properties (such as voltage, brightness, current efficiency (cd/A) and lifespan (the time before falling to 95% of original brightness (1000 cd/m$^2$) (LT95) and the time before falling to 50% of original brightness (1000 cd/m$^2$) (LT50))) of Organic light-emitting device (II) were measured by a spectra colorimeter and a luminance meter. The results are shown in Table 4.

Comparative Example 1

Comparative Example 1 was performed in the same manner as in Example 23 except that Compound (22) (having a chemical structure of

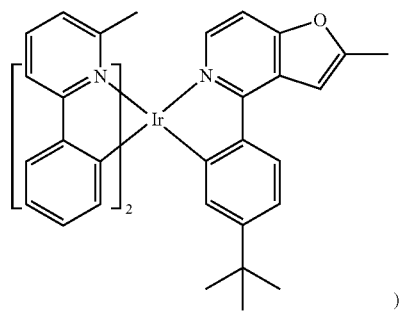

)

was substituted for Organic metal compound (VIII), obtaining Organic light-emitting device (III). The materials and layers of Organic light-emitting device (III) are described in the following: ITO/EHT-I-01/EHT-I-02/EPH-I-06: EPH-I-02: Compound (22)/ETM-785: LiQ/Al.

Next, the optical properties (such as voltage, brightness, current efficiency (cd/A) and lifespan (the time before falling to 95% of original brightness (1000 cd/m$^2$) (LT95) and the time before falling to 50% of original brightness (1000 cd/m$^2$) (LT50))) of Organic light-emitting device (III) were measured by a spectra colorimeter and a luminance meter. The results are shown in Table 4.

TABLE 4

| dopant | voltage (V) | brightness (cd/m²) | current efficiency (cd/A) | LT95 (hour) | LT50 (hour) |
|---|---|---|---|---|---|
| Example 23 — Organic metal compound (VIII) | 3.4 | 1,000 | 70.1 | 20,352 | 720,000 |
| Example 24 — Organic metal compound (XI) | 3.5 | 1,000 | 80.3 | 8,140 | 309,374 |
| Comparative Example 1 — Compound (22) | 3.4 | 1,000 | 70.0 | 2,862 | 134,649 |

As shown in Table 4, the lifetime of the organic light-emitting devices of Examples 23 and 24 are from 2.3 to 7.1 times longer than that of the organic light-emitting device of Comparative Example 1. It shows that the organic light-emitting devices employing Organic metal compounds (VIII) and (XI) exhibit great operating lifespan and luminescent efficiency, since the thermal stability and electrochemical stability of Organic metal compound (VIII) and (XI) are improved by introducing biphenyl group into the furopyridine ligand of Organic metal compound (VIII) and (XI) (i.e. Compound (22) does not have a furopyridine ligand with biphenyl group).

Example 25

Example 25 was performed in the same manner as in Example 23 except that Organic metal compound (XII) was substituted for Organic metal compound (VIII), obtaining Organic light-emitting device (IV). The materials and layers of Organic light-emitting device (IV) are described in the following: ITO/EHT-I-01/EHT-I-02/EPH-I-06: EPH-I-02: Organic metal compound (XII)/ETM-785: LiQ/Al.

Next, the optical properties (such as voltage, brightness, current efficiency (cd/A) and lifespan (the time before falling to 95% of original brightness (1000 cd/m²) (LT95) and the time before falling to 50% of original brightness (1000 cd/m²) (LT50))) of Organic light-emitting device (IV) were measured by a spectra colorimeter and a luminance meter. The results are shown in Table 5.

Example 26

Example 26 was performed in the same manner as in Example 23 except that Organic metal compound (IX) was substituted for Organic metal compound (VIII), obtaining Organic light-emitting device (V). The materials and layers of Organic light-emitting device (V) are described in the following: ITO/EHT-I-01/EHT-I-02/EPH-I-06: EPH-I-02: Organic metal compound (IX)/ETM-785: LiQ/Al.

Next, the optical properties (such as voltage, brightness, current efficiency (cd/A) and lifespan (the time before falling to 95% of original brightness (1000 cd/m²) (LT95) and the time before falling to 50% of original brightness (1000 cd/m² (LT50))) of Organic light-emitting device (V) were measured by a spectra colorimeter and a luminance meter. The results are shown in Table 5.

Example 27

Example 27 was performed in the same manner as in Example 23 except that Organic metal compound (X) was substituted for Organic metal compound (VIII), obtaining Organic light-emitting device (VI). The materials and layers of Organic light-emitting device (VI) are described in the following: ITO/EHT-I-01/EHT-I-02/EPH-I-06: EPH-I-02: Organic metal compound (X)/ETM-785: LiQ/Al.

Next, the optical properties (such as voltage, brightness, current efficiency (cd/A) and lifespan (the time before falling to 95% of original brightness (1000 cd/m²) (LT95) and the time before falling to 50% of original brightness (1000 cd/m²) (LT50))) of Organic light-emitting device (VI) were measured by a spectra colorimeter and a luminance meter. The results are shown in Table 5.

TABLE 5

| | dopant | voltage (V) | brightness (cd/m²) | current efficiency (cd/A) | lifespan LT95 (hour) | lifespan LT50 (hour) |
|---|---|---|---|---|---|---|
| Example 24 | organic metal compound (XI) | 3.5 | 1,000 | 80.3 | 8,140 | 309,374 |
| Example 25 | Organic metal compound (XII) | 3.66 | 1,000 | 72.30 | 12,912 | 464,498 |
| Example 23 | Organic metal compound (VIII) | 3.4 | 1,000 | 70.1 | 20,352 | 720,000 |
| Example 26 | Organic metal compound (IX) | 3.52 | 1,000 | 69.62 | 36,240 | 949,792 |

TABLE 5-continued

| | | | current | lifespan | |
|---|---|---|---|---|---|
| dopant | voltage (V) | brightness (cd/m$^2$) | efficiency (cd/A) | LT95 (hour) | LT50 (hour) |
| Example 27 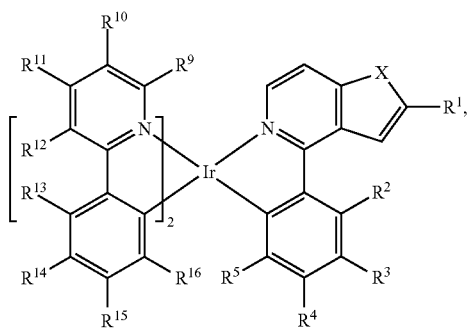 | 3.34 | 1,000 | 71.62 | 129,168 | 3,770,000 |
| Organic metal compound (X) | | | | | |

As shown in Table 5, the lifetime (LT95) of the organic light-emitting device of Examples 25 is 1.59 times longer than that of the organic light-emitting device of Example 24, since Organic metal compound (XII) used in Example 25 has a deuterated methyl group replacing methyl group bonded to the phenylpyridine ligand of Organic metal compound (XI) used in Example 24. In addition, the lifetime (LT95) of the organic light-emitting device of Examples 26 is 1.78 times longer than that of the organic light-emitting device of Example 23, since Organic metal compound (IX) used in Example 26 has a deuterium replacing hydrogen of the furopyridine ligand of Organic metal compound (VIII) used in Example 23. Furthermore, the lifetime (LT95) of the organic light-emitting device of Examples 27 is 3.56 times longer than that of the organic light-emitting device of Example 26, since Organic metal compound (X) used in Example 27 has a deuterated methyl group replacing methyl group bonded to the phenylpyridine ligand of Organic metal compound (IX) used in Example 26.

Although the disclosure has been described by way of example and in terms of the preferred embodiments, it should be understood that various modifications and similar arrangements (as would be apparent to those skilled in the art) can be made herein without departing from the spirit and scope of the disclosure as defined by the appended claims.

What is claimed is:

1. An organic metal compound, which has a chemical structure of Formula (II):

Formula (II)

wherein X is O or S; R$^1$ is hydrogen or deuterium; R$^2$, R$^4$ and R$^5$ are hydrogen; R$^3$ is phenyl group; R$^9$, R$^{10}$, R$^{11}$ and R$^{12}$ are independently hydrogen, halogen, deuterium, C$_{1-6}$ alkyl group, C$_{1-6}$ deuterated alkyl group, C$_{1-6}$ fluoroalkyl group, or two adjacent groups of R$^9$, R$^{10}$, R$^{11}$ and R$^{12}$ are optionally combined with the carbon atoms which R$^9$, R$^{10}$, R$^{11}$ and R$^{12}$ are attached to, to form an aryl group or a cycloalkyl group, wherein R$^{13}$, R$^{14}$, R$^{15}$ and R$^{16}$ are independently hydrogen, halogen, C$_{1-6}$ alkyl group, C$_{1-6}$ fluoroalkyl group, or two adjacent groups of R$^{13}$, R$^{14}$, R$^{15}$ and R$^{16}$ are optionally combined with the carbon atoms which R$^{13}$, R$^{14}$, R$^{15}$ and R$^{16}$ are attached to, to form an aryl group or a cycloalkyl group.

2. The organic metal compound as claimed in claim 1, wherein the organic metal compound is wherein R$^1$ is hydrogen or deuterium; R$^2$, R$^4$ and R$^5$ are hydrogen; R$^3$ is phenyl group; R$^9$, R$^{10}$, R$^{11}$ and R$^{12}$ are independently hydrogen, halogen, deuterium, C$_{1-6}$ alkyl group, C$_{1-6}$ deuterated alkyl group, C$_{1-6}$ fluoroalkyl group, or two adjacent groups of R$^9$, R$^{10}$, R$^{11}$ and R$^{12}$ are optionally combined with the carbon atoms which R$^9$, R$^{10}$, R$^{11}$ and R$^{12}$ are attached to, to form an aryl group or a cycloalkyl group; and R$^{13}$, R$^{14}$, R$^{15}$, and R$^{16}$ are independently hydrogen, halogen, C$_{1-6}$ alkyl group, C$_{1-6}$ fluoroalkyl group, or two adjacent groups of R$^{13}$, R$^{14}$, R$^{15}$, and R$^{16}$ are optionally combined with the carbon atoms which R$^{13}$, R$^{14}$, R$^{15}$, and R$^{16}$ are attached to, to form an aryl group or a cycloalkyl group.

3. The organic metal compound as claimed in claim 2, wherein the organic metal compound is

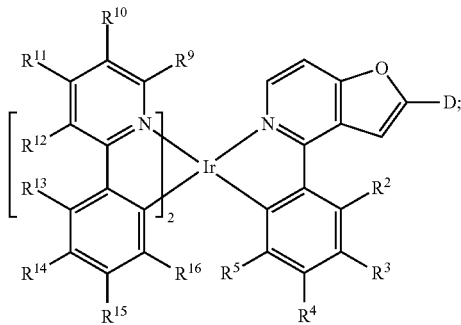

$R^2$, $R^4$ and $R^5$ are hydrogen; $R^3$ is phenyl group; $R^9$, $R^{10}$, $R^{11}$ and $R^{12}$ are independently hydrogen, halogen, deuterium, $C_{1-6}$ alkyl group, $C_{1-6}$ deuterated alkyl group, $C_{1-6}$ fluoroalkyl group, or two adjacent groups of $R^9$, $R^{10}$, $R^{11}$ and $R^{12}$ are optionally combined with the carbon atoms which $R^9$, $R^{10}$, $R^{11}$ and $R^{12}$ are attached to, to form an aryl group or a cycloalkyl group; and $R^{13}$, $R^{14}$, $R^{15}$, and $R^{16}$ are independently hydrogen, halogen, $C_{1-6}$ alkyl group, $C_{1-6}$ fluoroalkyl group, or two adjacent groups of $R^{13}$, $R^{14}$, $R^{15}$, and $R^{16}$ are optionally combined with the carbon atoms which $R^{13}$, $R^{14}$, $R^{15}$, and $R^{16}$ are attached to, to form an aryl group or a cycloalkyl group.

4. The organic metal compound as claimed in claim 2, wherein the organic metal compound is

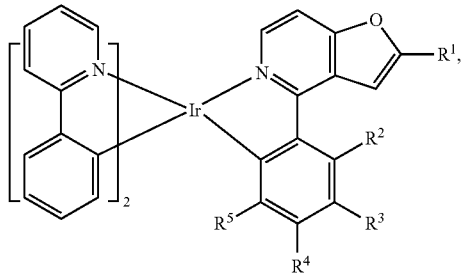

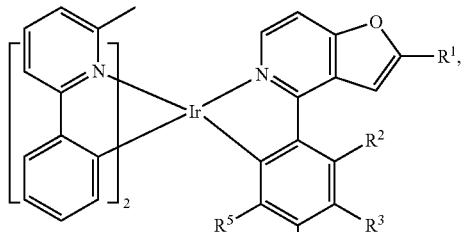

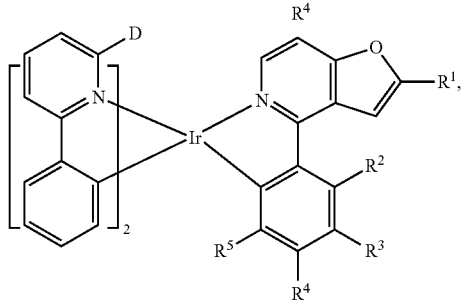

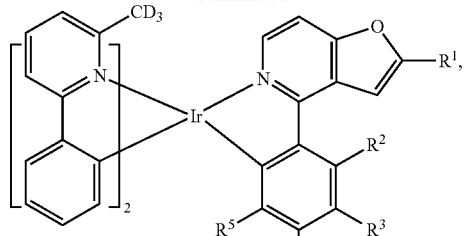

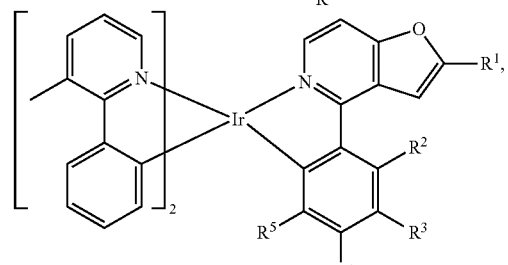

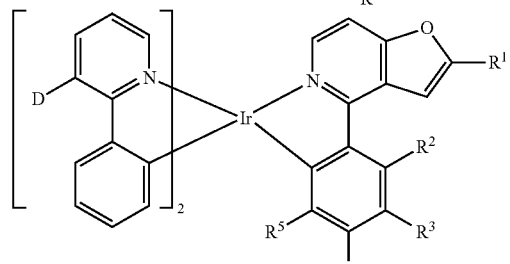

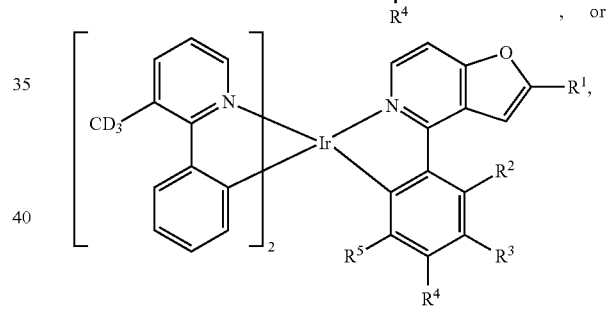

, or wherein $R^1$ is hydrogen or deuterium; $R^2$, $R^4$ and $R^5$ are hydrogen; and $R^3$ is phenyl group.

5. The organic metal compound as claimed in claim 1, wherein the organic metal compound is

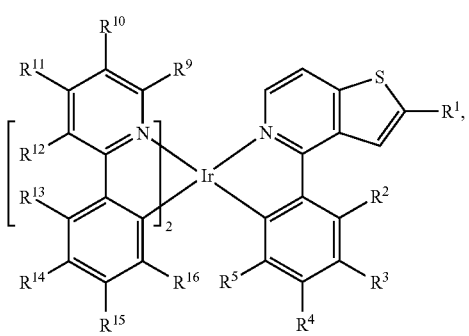

wherein $R^1$ is hydrogen or deuterium; $R^2$, $R^4$ and $R^5$ are hydrogen; $R^3$ is phenyl group; $R^9$, $R^{10}$, $R^{11}$ and $R^{12}$ are independently hydrogen, halogen, deuterium, $C_{1-6}$ alkyl group, $C_{1-6}$ deuterated alkyl group, $C_{1-6}$ fluoroalkyl group, or two adjacent groups of $R^9$, $R^{10}$, $R^{11}$ and $R^{12}$ are optionally combined with the carbon atoms which $R^9$, $R^{10}$, $R^{11}$ and $R^{12}$ are attached to, to form an aryl group or a cycloalkyl group; and $R^{13}$, $R^{14}$, $R^{15}$, and $R^{16}$ are independently hydrogen, halogen, $C_{1-6}$ alkyl group, $C_{1-6}$ fluoroalkyl group, or two adjacent groups of $R^{13}$, $R^{14}$, $R^{15}$, and $R^{16}$ are optionally combined with the carbon atoms which $R^{13}$, $R^{14}$, $R^{15}$, and $R^{16}$ are attached to, to form an aryl group or a cycloalkyl group.

6. The organic metal compound as claimed in claim 5, wherein the organic metal compound is

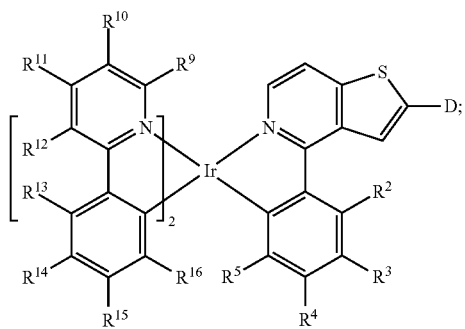

$R^2$, $R^4$ and $R^5$ are hydrogen; $R^3$ is phenyl group; $R^9$, $R^{10}$, $R^{11}$ and $R^{12}$ are independently hydrogen, halogen, deuterium, $C_{1-6}$ alkyl group, $C_{1-6}$ deuterated alkyl group, $C_{1-6}$ fluoroalkyl group, or two adjacent groups of $R^9$, $R^{10}$, $R^{11}$ and $R^{12}$ are optionally combined with the carbon atoms which $R^9$, $R^{10}$, $R^{11}$ and $R^{12}$ are attached to, to form an aryl group or a cycloalkyl group; and $R^{13}$, $R^{14}$, $R^{15}$, and $R^{16}$ are independently hydrogen, halogen, $C_{1-6}$ alkyl group, $C_{1-6}$ fluoroalkyl group, or two adjacent groups of $R^{13}$, $R^{14}$, $R^{15}$, and $R^{16}$ are optionally combined with the carbon atoms which $R^{13}$, $R^{14}$, $R^{15}$, and $R^{16}$ are attached to, to form an aryl group or a cycloalkyl group.

7. The organic metal compound as claimed in claim 1, wherein the organic metal compound is

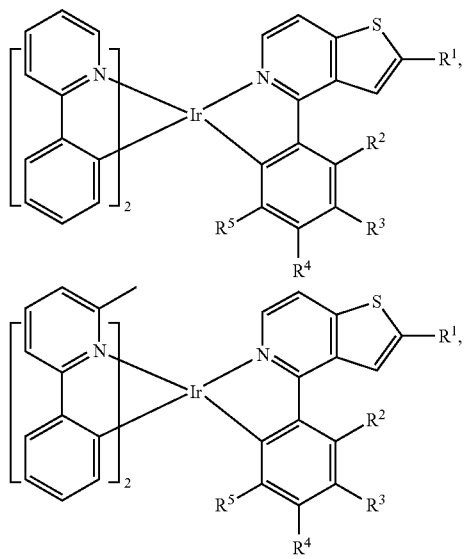

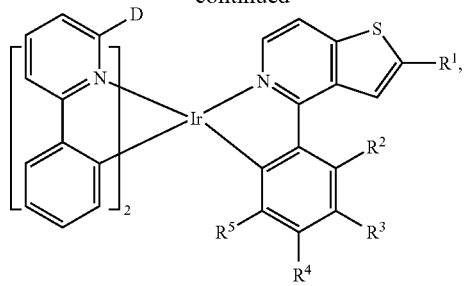

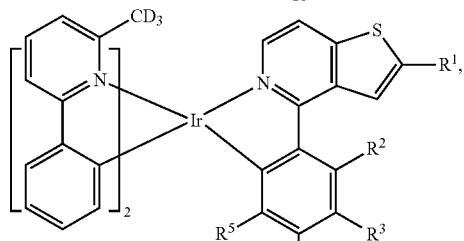

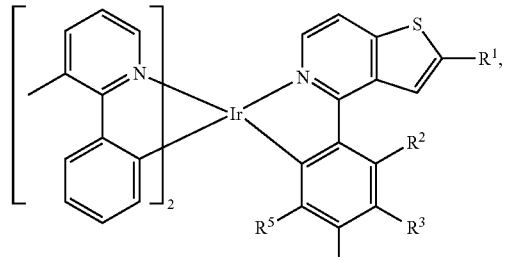

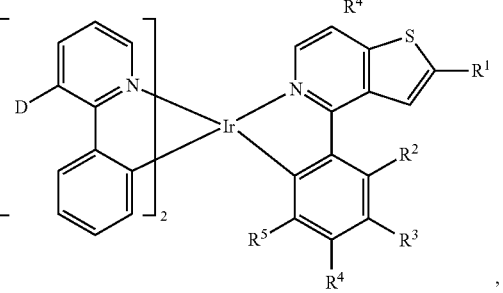

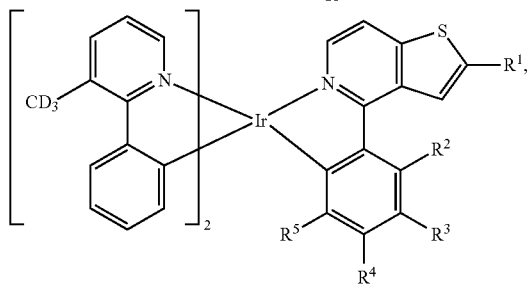

wherein $R^1$ is hydrogen or deuterium; $R^2$, $R^4$ and $R^5$ are hydrogen; and $R^3$ is phenyl group.

8. An organic light-emitting device, comprising:
a pair of electrodes; and
an organic light-emitting element disposed between the pair of electrodes,
wherein the organic light-emitting element comprises the organic metal compound as claimed in claim 1.

* * * * *